United States Patent [19]

Kawaguchi

[11] Patent Number: 5,739,573
[45] Date of Patent: Apr. 14, 1998

[54] SEMICONDUCTOR DEVICE WITH IMPROVED SALICIDE STRUCTURE AND A METHOD OF MANUFACTURING THE SAME

[75] Inventor: Hiroshi Kawaguchi, Tokyo, Japan

[73] Assignee: Nec Corporation, Japan

[21] Appl. No.: 935,993

[22] Filed: Sep. 23, 1997

Related U.S. Application Data

[63] Continuation of Ser. No. 496,371, Jun. 29, 1995, abandoned.

[30] Foreign Application Priority Data

Jul. 22, 1994 [JP] Japan ................................ 6-170604

[51] Int. Cl.$^6$ ......................... H01L 29/76; H01L 29/94; H01L 27/088
[52] U.S. Cl. ......................... 257/384; 257/368; 257/382; 257/383; 257/388; 257/900; 438/302; 438/305
[58] Field of Search ......................... 257/368, 382, 257/383, 384, 388, 900; 438/302, 305

[56] References Cited

U.S. PATENT DOCUMENTS

| | | | |
|---|---|---|---|
| 4,638,347 | 1/1987 | Iyer | 257/900 |
| 4,714,951 | 12/1987 | Baudrant et al. | 257/384 |
| 4,908,326 | 3/1990 | Ma et al. | 257/900 |
| 5,053,848 | 10/1991 | Houston et al. | 257/384 |
| 5,068,696 | 11/1991 | Yang et al. | 257/384 |
| 5,162,882 | 11/1992 | Pollack | 257/900 |
| 5,183,771 | 2/1993 | Mitsui et al. | 437/44 |

OTHER PUBLICATIONS

Thin Solid Films, vol. 198, pp. 53–66, 1991.

IEEE Transactions on Electron Devices, vol. 38–2, pp. 262–269, 1991.

"Titanium Disilicide Self-Aligned Source/Drain + Gate Technology" IEEE, IEDM 82, pp. 714–717, 1982.

"High Conductivity Diffusions and Gate Regions Using Self-Aligned Silicide Technology", by C.M. Osburn, et al., pp. 213–223.

*Primary Examiner*—Valencia Martin Wallace
*Attorney, Agent, or Firm*—Hayes, Soloway, Hennessey, Grossman & Hage, P.C.

[57] ABSTRACT

A semiconductor device includes a gate insulating film on a semiconductor region of a first conductive type. There is provided on the gate insulating film a gate electrode having a channel length under a design rule of 350 nm or below. The gate electrode includes a first conductive film and a first silicide film formed on the first conductive film and a contact length between the first conductive film and the first silicide film in a channel length direction is longer than the channel length. Source and drain regions each including an impurity layer of a second conductive type formed on the surface of the semiconductor region and a second silicide film formed on the impurity layer. An insulating film spacer structure is provided to contact with side surfaces of the first conductive film of the gate electrode and to have a top surface thereof higher than a top surface of the gate electrode.

27 Claims, 18 Drawing Sheets

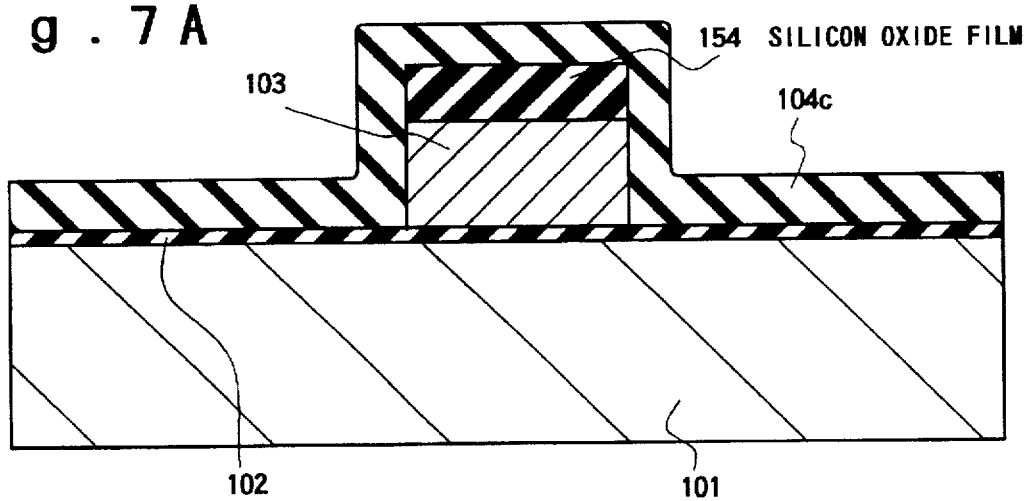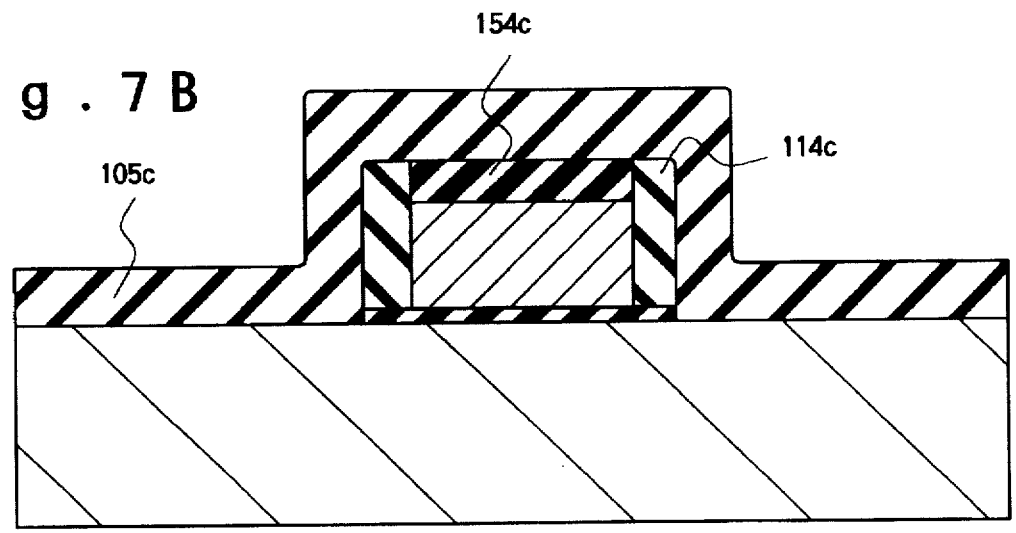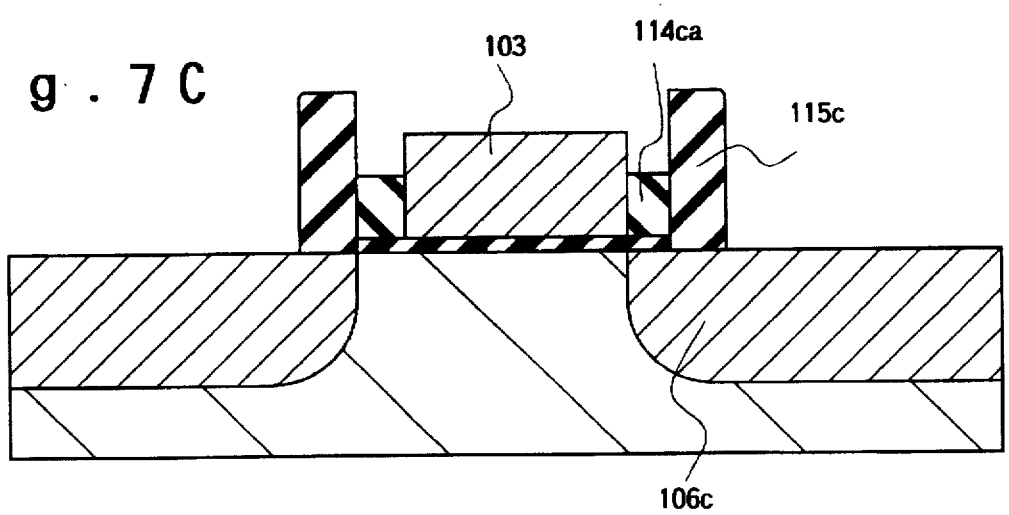

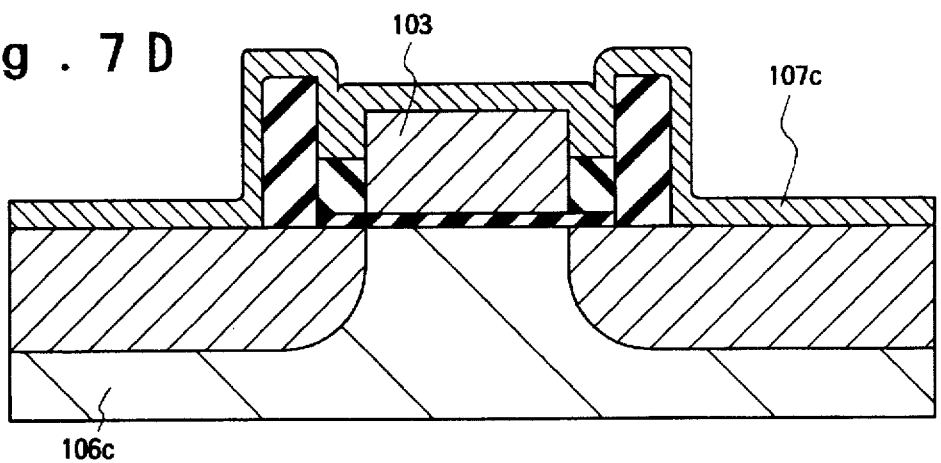
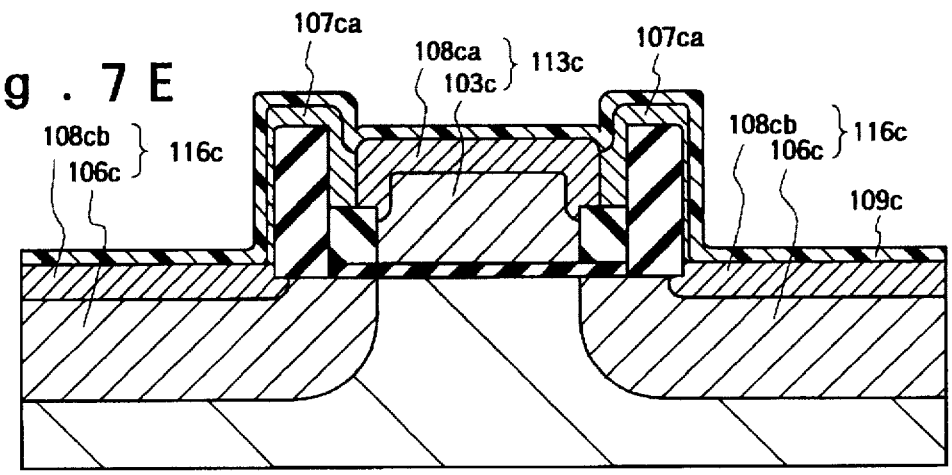
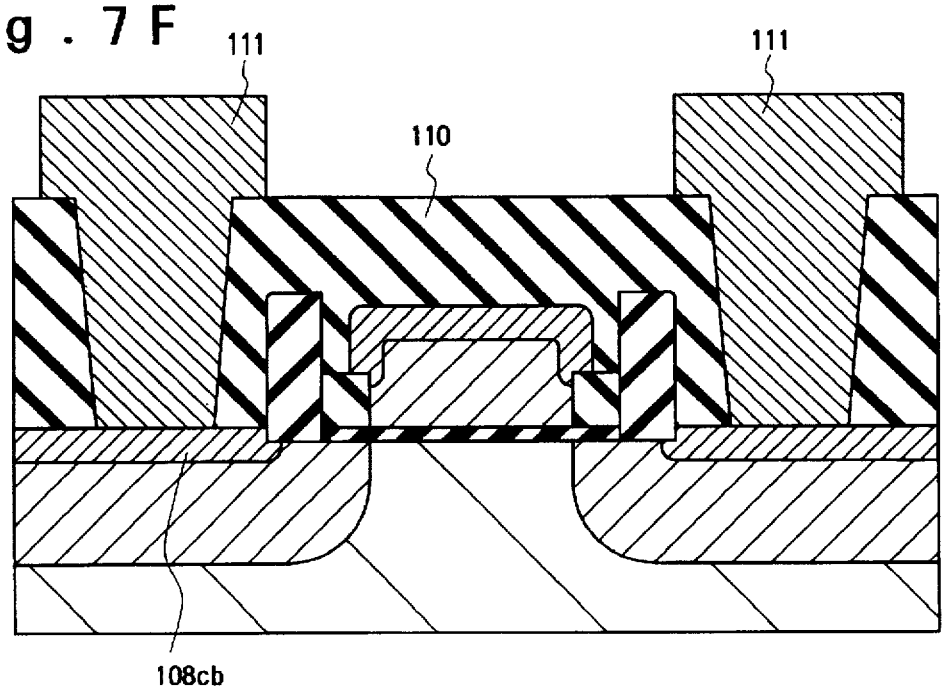

207a TITANIUM FILM

208aa TITANIUM SILICIDE FILM ⎫
207aa                       ⎬ 213a GATE ELECTRODE
203ad                       ⎭
207aa
208ab ⎫ 216a SOURCE AND
206a  ⎬ DRAIN REGION
209a TITANIUM NITRIDE FILM

211 METAL WIRING
210 INTERLAYER INSULATING FILM
211

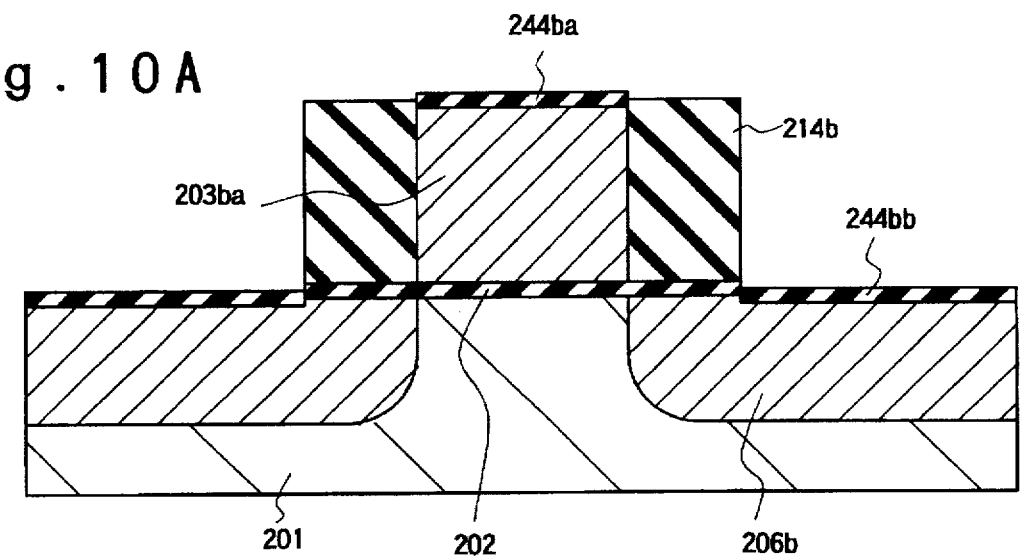
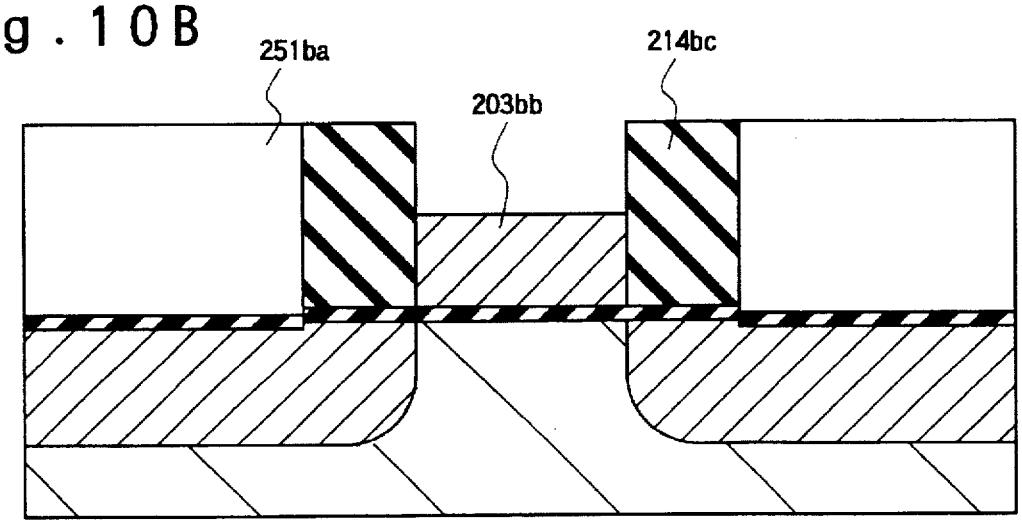
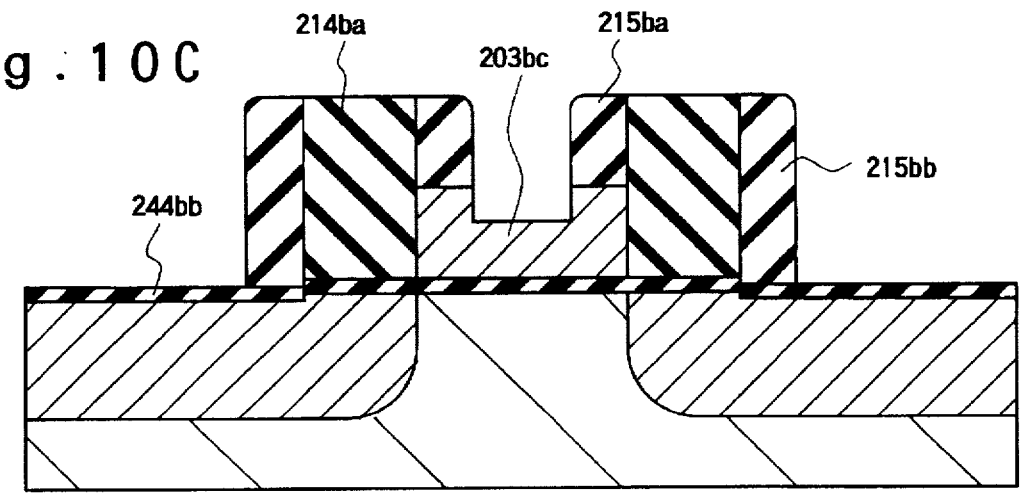

SEMICONDUCTOR DEVICE WITH IMPROVED SALICIDE STRUCTURE AND A METHOD OF MANUFACTURING THE SAME

This is a continuation of application Ser. No. 08/496,371 filed on Jun. 29, 1995 now abandoned.

BACKGROUND OF THE INVENTION

1. Field of the Invention

The present invention relates to a semiconductor device and a method of manufacturing the same, and more particularly, a semiconductor device including a MOS transistor with an improved salicide structure and a method of manufacturing the same.

2. Description of Related Art

In a conventional semiconductor device including a plurality of MOS transistors, the high density integration and high operation speed of the MOS transistors has been achieved mainly through reduction in size of the MOS transistors such as the thickness of a gate insulating film, a gate length, a gate width, a width of a diffusion layer and a wiring pitch. The further higher operation speed of the semiconductor device could not achieved unless any measurement is further taken, because parasitic resistance is increased with the above reduction.

Conventionally, in order to achieve the high operation speed of the semiconductor device, a sheet resistance of a gate electrode was decreased until the design rule reaches a design rule of a submicron order. In this stage, a polycide structure of a lamination film formed of a polysilicon film of, for example, an n-type and a silicide film of metal having a high melting point was employed as the gate electrode structure. A tungsten silicide film or molybdenum silicide film was mainly used as the high melting point metal silicide. It should be noted that it is extremely preferable for the gate electrode to have a polycide structure using a titanium silicide film with respect to a low sheet resistance. Nevertheless, the gate electrode of the polycide structure using the titanium silicide film was not used in practice. This is because it is very difficult to etch (dry etch) the lamination film of the titanium silicide film and the polysilicon film.

When the design rule becomes the submicron order, it became difficult to achieve the higher speed operation of a semiconductor device only by decreasing the sheet resistance of the gate electrode. This is because the sheet resistance between the gate region and contact holes in source and drain regions to which wirings are connected, is a main factor to prevent the semiconductor device from operating at higher speed. Consequently, it is important to decrease the parasitic resistance in the semiconductor devices developed in accordance with the submicron design rule. Coping with the situation, a MOS transistor is put to practical use which has a salicide structure in which a silicide film of a metal having a high melting point is formed on the surface of a polysilicon film pattern as the gate electrode and the diffusion layers as the source and drain regions with self-alignment. A titanium silicide film is used mainly as the high melting point silicide film and use of cobalt silicide film and nickel silicide film are also discussed and reported other than the titanium silicide film.

A method of manufacturing a MOS transistor, for example, an n-channel MOS transistor having a salicide structure using the titanium silicide film will be described below.

A field insulating film and a gate insulating film are formed on a p-type silicon substrate by a thermal oxidization method. An n-type polysilicon film is formed on the whole of surface and patterned so that a polysilicon film pattern is formed. A silicon oxide film is formed on the whole of surface by a vapor deposition method and etched back by an anisotropic etching method to form silicon oxide film spacers on the side surfaces of the polysilicon film pattern. Generally, the height of each of the silicon oxide film spacers is equal to the thickness of the polysilicon film pattern. An n-type diffusion layer is formed by performing ion injection using the polysilicon film pattern and the silicon oxide film spacers as a mask. In a case where the width of each of the silicon oxide film spacers is wide, which is approximately equal to the thickness of the silicon oxide film, there is a case that n-type diffusion layers of a low density are formed by performing ion injection using the polysilicon film pattern as a mask prior to the formation of the silicon oxide film spacers (or the silicon oxide film). A titanium film is formed on the whole of surface by a sputtering method and is subjected to a lamp annealing method in a nitrogen ($N_2$) ambient to form first and second titanium silicide film on the surface of polysilicon film pattern and the surface of diffusion layers with self-alignment. In this case, a titanium nitride film is formed on the titanium film and a part of the titanium film which directly contacts the silicon oxide film spacers is ideally remained in a non-reacted state. The non-reacted titanium film and titanium nitride film are etched and removed by hydrogen peroxide ($H_2O_2$) water (there is a case that ammonia ($NH_4OH$) is added). In this manner, the MOS transistor is completed. Further, formation of an interlayer insulating film, contact holes and metal wirings is performed.

The reason why the titanium silicide film is used in many cases is in the above-mentioned etching workability. In the other high melting point silicide film, it is not necessarily easy to keep the high melting point metal silicide film remained and to selectively remove only the non-reacted high melting point metal film. The temperature of the lamp annealing is in a range of 600° to 900° C. In a case that the lamp annealing temperature is low, the titanium silicide film thus obtained has a C49 structure which appears in a high resistance phase. On the other hand, in a case that the lamp annealing temperature is high, the titanium silicide film thus obtained has a C54 structure which appears in a low resistance phase. The resistivity of the titanium silicide film having the C54 structure is as many as about 15 $\mu\Omega.cm$.

The high speed operation of a transistor has been achieved by a MOS transistor having the above structure, i.e., the salicide structure using the titanium silicide film, until the design rule reaches a half micron design rule. As described in a paper (IEEE TRANSACTION ON ELECTRON DEVICES Vol. 38–2, pp. 262 to 269, 1991), if a gate length is shortened, there is increased apparent phase transition temperature of the titanium silicide film from the C49 structure to the C54 structure. Further, the titanium silicide film having the C54 structure condenses by heat treatment to increase apparent resistivity. This condensation is a function of the temperature and time of heat treatment. Therefore, it is difficult to obtain a gate electrode having a low resistance in 0.35 µm design rule for example.

A method of shortening the gate length without increasing the resistivity of the titanium silicide film having the C54 structure is reported in a paper (Thin Solid Films, Vol. 198, pp. 53 to 66, 1991). The inventor of the present invention double-checked.

The inventor tried to manufacture an n-channel MOS transistor having a salicide structure based on the above report using a part of the present invention. The result will be described below with reference to FIG. 1A to 1B.

First, a field insulating film and a gate insulating film 302 are formed on a p-type silicon substrate 301 by a thermal oxidization method. An n-type polysilicon film is formed on the whole of surface and patterned so that a polysilicon film pattern 303 is formed, as shown in FIG. 1A. A silicon oxide film 304 is formed on the whole of surface by a vapor deposition method and etched back by an anisotropic etching method to form silicon oxide film spacers 314 on the side surfaces of the polysilicon film pattern. The height of each of the silicon oxide film spacers is lower than the thickness of the polysilicon film pattern. Then, n-type diffusion layers 306 are formed by performing ion injection using the polysilicon film pattern and the silicon oxide film spacers as a mask. Subsequently, as shown in FIG. 1B, a titanium film is formed on the whole of surface by a sputtering method. Next, the titanium film 307 is subjected to a lamp annealing method in a nitrogen ($N_2$) ambient to form first and second titanium silicide films 308a and 308b on the surface of polysilicon film pattern and the surface of diffusion layers with self-alignment. In this case, a titanium nitride film 309 is formed on the titanium film and a part of the titanium film which directly contacts the silicon oxide film spacers is ideally remained in a non-reacted state. The non-reacted titanium film and titanium nitride film are etched and removed. In this manner, the MOS transistor is completed. Further, formation of an interlayer insulating film, contact holes and metal wirings is performed.

FIG. 2 is a schematic cross sectional view of a complete semiconductor device. Referring to FIG. 2, on the surface of the p-type silicon substrate 301 are provided the gate insulating film 302 having a thickness of about 8 nm, the field insulating film (not shown) and n-type diffusion layers 306 each having a junction depth of about 0.15 μm. A gate electrode 313 is formed on the p-type silicon substrate 301 via the gate insulating film 302. The gate electrode is constituted of a laminated film composed of the n-type polysilicon film pattern 303a having a film thickness of about 360 nm and a width, i.e., a gate length of about 350 nm and the titanium silicide film 308a having a film thickness of about 80 nm. The silicon oxide film spacers 314 are provided on the side surfaces of the gate electrode 313 to each have the width of about 150 nm and the height of about 250 nm. The titanium silicide films 308b having the thickness of about 80 nm are formed on the n-type diffusion layers 306 in self-alignment with the silicon oxide film spacers 314. The source and drain regions 316 are constituted of these n-type diffusion layers 306 and titanium silicide films 308b.

In a stage before the titanium silicide films 308a and 308b are formed, the polysilicon film pattern 400 has the thickness of about 400 nm and the titanium film has the thickness of about 100 nm. In this stage, the top of each of the silicon oxide film spacers 314, i.e., the height is lower than that of the polysilicon film pattern, i.e., the film thickness by about 150 nm. The contact length of the titanium film and the polysilicon film in a gate length direction is about 650 nm so that it is sufficiently long compared to a gate length of about 350 nm. Lamp annealing is performed in a nitrogen ambient for 30 sec. at 650° C. and further 10 sec. at 850° C. Since the contact length of the titanium film and polysilicon film in the gate length direction is longer than the gate length, the titanium silicide films 308a and 308b formed by the lamp annealing has the C54 structure and the resistivity is approximately equal to 15 μΩ·cm.

As described above, the increase of resistivity of the titanium silicide film can be prevented by the technique described in the report. However, the technique described in the report cannot solve a problem so-called "bridging phenomenon".

FIG. 3 is a schematic cross sectional view of a semiconductor device. Referring to FIG. 3, titanium silicide films 308c are locally formed on the surfaces of the silicon oxide film spacers 314 when the titanium film is subjected to the lamp annealing in a nitrogen ambient. The cause of this phenomenon is not apparent. These titanium silicide films 308c act to form a leak path between the titanium silicide film 308a of the gate electrode 313 and each of titanium silicide films 308b of the source and drain regions 316 to increase leak current so that any short circuit is finally formed. The bridging phenomenon collectively involves the local presence of the titanium silicide films 308c on the surfaces of the silicon oxide film spacers 314 and the increase in leak current and occurrence of a short circuit. The value of leak current and the frequency of occurrence of a short circuit is reversely proportional to the distance between the titanium silicide film 308a and the titanium silicide film 308b along the surface of each of the silicon oxide film spacers 314. For this reason, even if the technique described in the report is used, the bridging phenomenon is more significant than in usual cases.

SUMMARY OF THE INVENTION

Therefore, the present invention has, as an object, to provide a semiconductor device having a salicide structure of a silicide film in which the bridging phenomenon can be prevented or suppressed without increasing the resistivity of the silicide film, and a method of manufacturing the same.

In order to achieve an aspect of the present invention, a semiconductor device includes a gate insulating film on a semiconductor region of a first conductive type; a gate electrode having a predetermined gate length, provided on the gate insulating film, and comprising a conductive polysilicon film and a first silicide film formed on the conductive polysilicon film, a contact length between the conductive polysilicon film and the first silicide film in a gate length direction being longer than the gate length; source and drain regions of a second conductive type, each of which comprises an impurity layer formed on the surface of the semiconductor region and a second silicide film formed on the impurity layer; and an insulating film spacer structure including first and second insulating film spacers, each of the first insulating film spacers being provided to contact with a side surface of the conductive polysilicon film of the gate electrode and each of the second insulating film spacers having the top surface thereof higher than a top surface of the gate electrode.

According to another aspect of the present invention, a semiconductor device, includes a gate insulating film on a semiconductor region of a first conductive type; a gate electrode having a predetermined gate length, provided on the gate insulating film, and comprising a conductive polysilicon film with a concave portion or convex portion having a predetermined depth or height and extending in a gate length direction, and a first silicide film formed on the first conductive film, a contact length between the first conductive film and the first silicide film in a gate length direction being longer than the gate length; source and drain regions of a second conductive type, each of which comprises an impurity layer formed on the semiconductor region and second silicide films formed on the impurity layers, respectively; and an insulating film spacer structure including insulating film spacers, each of which is provided to contact with a side surface of the first conductive film and the first silicide film of the gate electrode and to have a top surface thereof higher than a top surface of the first silicide film of the gate electrode.

The insulating film spacer structure preferably has a separation distance equal to or longer than the contact length between the first silicide film and each of the second silicide films of the source and drain regions along the surface of the spacer structure under the design rule of 350 nm or below. When the gate length is 200 nm, the semiconductor device according to the present invention requires the contact length of 200 nm and the separation length of 250 nm at least. It would be difficult to reduce these values as scaling down of a MOS transistor. Therefore, when the gate length is 150 nm or below, these values would need to satisfied.

The first insulating film spacers may be equal to or lower than a top surface of the conductive polysilicon film of the gate electrode and the second insulating film spacers may be respectively provided on parts of the first insulating film spacers apart from the gate electrode to have portions extending upward higher than the top surface of the gate electrode. Alternatively, the first insulating film spacers may be equal to or lower than a top surface of the conductive polysilicon film of the gate electrode and the second insulating film spacers may be respectively provided on the semiconductor region to contact with side surfaces of the first insulating film opposite to the gate electrode spacers apart from the gate electrode and to have portions extending upward higher than a top surface of the gate electrode. In either case, it is preferable that at least one of the first insulating film spacers and the second insulating film spacers is nitride film spacers.

Each of the first and second silicide films has a resistivity as low as 15 $\mu\Omega$.cm or below and a contact length between the conductive polysilicon film and the first silicide film in a gate length direction is preferably longer than the gate length. When the conductive polysilicon film has a convex or concave surface portion in the gate length direction, the contact length can be elongated.

In order to achieve an aspect of the present invention, a method of manufacturing a semiconductor device, includes the steps of:

forming a gate insulating film on a semiconductive silicon region of a first conductive type;

forming a gate polysilicon film pattern for a gate electrode to have a predetermined gate length;

forming an insulating film spacer structure including at least two insulating film spacers as first and second insulating film spacers, wherein the first insulating film spacers are contact with the side surfaces of the gate polysilicon film pattern such that the top surfaces of the first insulating film spacers are lower than a top surface of the gate polysilicon film pattern;

forming source and drain regions of a second conductive type on the surface of the semiconductive silicon region using the gate polysilicon film pattern and the insulating film spacer structure as a mask;

depositing a metal film on the whole surface; and forming a first silicide film from the metal film and the gate polysilicon film pattern and second silicide films from the metal film and the source and drain regions, such that a contact length between the first silicide film and the non-silicided gate polysilicon film pattern in a gate length direction is longer than the gate length.

In order to achieve another aspect of the present invention, a method of manufacturing a semiconductor device, may include the steps of:

forming a gate insulating film on a semiconductive silicon region of a first conductive type;

forming a polysilicon film for a gate electrode, to have a predetermined gate length and to have a film thickness thicker than the gate length;

forming insulating film spacers which are contact with the side surfaces of the polysilicon film pattern to have the same height as the polysilicon film;

selectively etching the polysilicon film to form a gate polysilicon film pattern such that a surface length of the gate polysilicon film spacer in a gate length direction is longer than the gate length;

forming source and drain regions of a second conductive type on the surface of the semiconductive silicon region using the gate polysilicon film pattern and the insulating film spacers as a mask;

depositing a titanium film on the whole surface; and forming a first silicide film from the titanium film and the gate polysilicon film pattern and second silicide films from the metal film and the source and drain regions.

The insulating film spacer structure may be formed by depositing a first insulating film on the whole surface including the gate polysilicon film pattern; depositing a second insulating film on the first insulating film; selectively etching back the second insulating film by an anisotropic etching method to form the second insulating film spacers on the first insulating film apart from the gate polysilicon film pattern and the first silicide film such that the second insulating film spacers have the heights higher than the top surface of the first silicide film; and selectively etching back the first insulating film by an anisotropic etching method to form the first insulating film spacers which have the second insulating film spacers provided thereon and are contact with the gate polysilicon film pattern to have the height lower than the top surface of the gate polysilicon film pattern. Or, the insulating film spacer structure may be formed by depositing a first insulating film on the whole surface including the gate polysilicon film pattern; depositing a second insulating film on the first insulating film; depositing a third insulating film on the second insulating film; selectively etching back the third insulating film by an anisotropic etching method to form the third insulating film spacers on the second insulating film; selectively etching back the second insulating film by an anisotropic etching method to form the second insulating film spacers such that the second insulating film spacers have the heights higher than the top surface of the first silicide film; and selectively etching back the first insulating film by an anisotropic etching method to form first insulating film spacers which have the second insulating film spacers provided thereon and are contact with the gate polysilicon film pattern to have the height lower than the top surface of the gate polysilicon film pattern.

If a concave portion is formed on the surface of the gate polysilicon film pattern such that the concave portion has a predetermined depth and extends in the direction of the gate length, the contact length can be elongated.

In order to form the first and second silicide films, the metal (titanium) film is deposited, the surface of the titanium film is nitrided, the first and second silicide films is formed using the non-nitrided titanium film, and removing the titanium nitride film and the remained titanium film. The metal film is preferably deposited by a collimated sputtering method. In this case, the surface of the titanium film such that the titanium film on the side surfaces of the spacer structure on the side opposite to the gate polysilicon film pattern can be readily nitrided completely.

The nitriding step and the step of forming the first and second silicide films may be simultaneously performed by annealing in a nitrogen ambient or only the nitriding step may be performed by a plasma nitriding method.

Since two steps of annealing is performed at a relatively low temperature and then at a relatively high temperature, the first and second silicide films are first formed to have a C49 structure and then the C49 structure is changed to a C54 structure, resulting in the silicide films having a low resistivity.

BRIEF DESCRIPTION OF THE DRAWINGS

FIGS. 7A to 7F are schematic cross sectional views showing the manufacturing processes of the semiconductor device according to the third embodiment of the present invention;

FIGS. 10A to 10G are schematic cross sectional views showing the manufacturing processes of the semiconductor device according to the sixth embodiment of the present invention.

DESCRIPTION OF THE PREFERRED EMBODIMENT

The present invention will be described below with reference to the accompanying drawings.

Figure 1A:
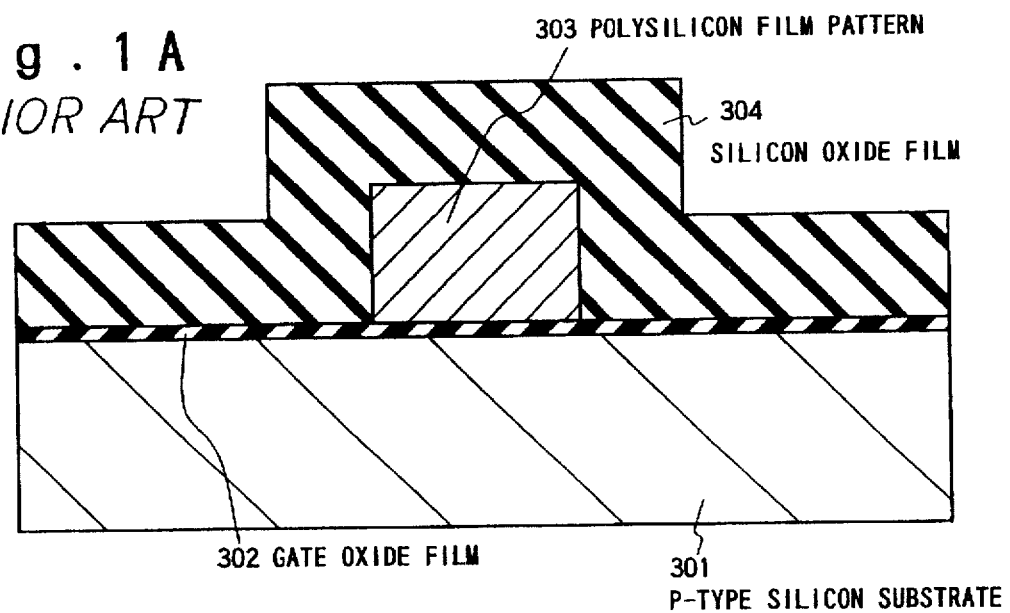
FIGS. 1A to 1C are schematic cross sectional views when a conventional semiconductor device is experimentally manufactured by the inventor.
Figure 1B:
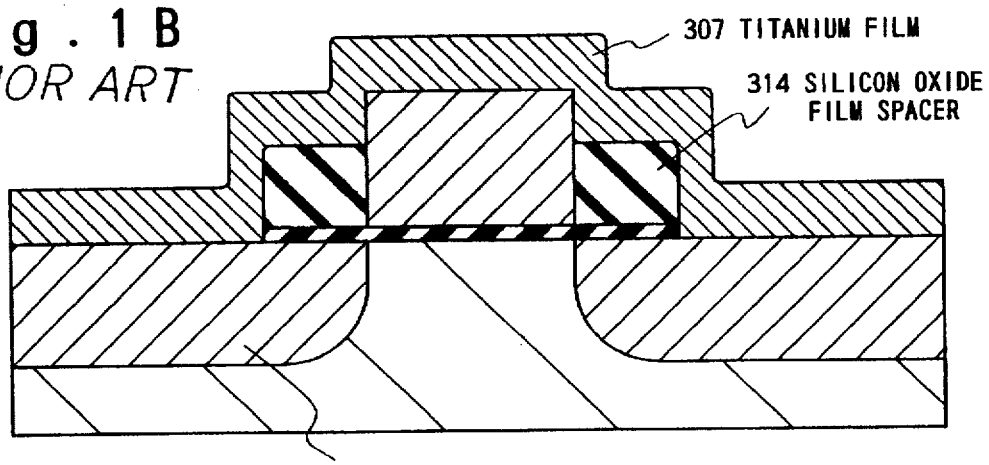
Figure 1C:
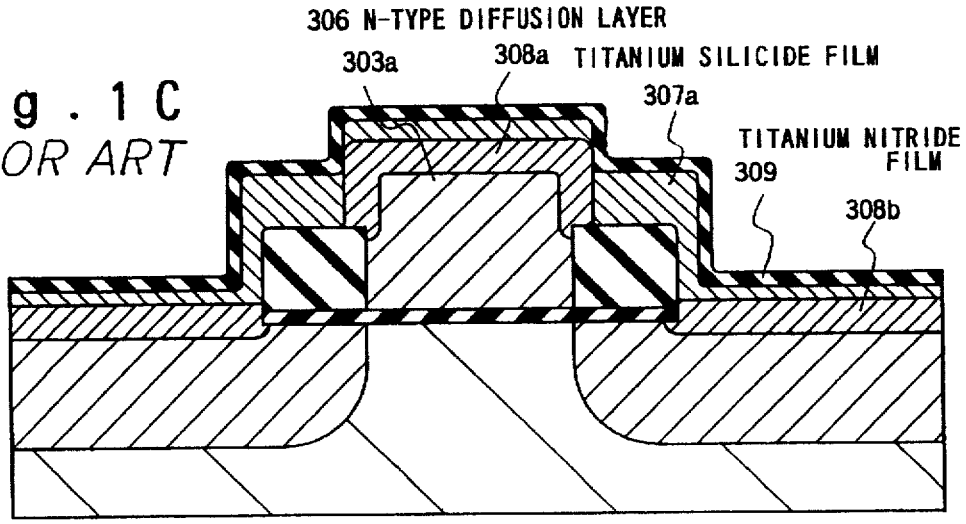
Figure 2:
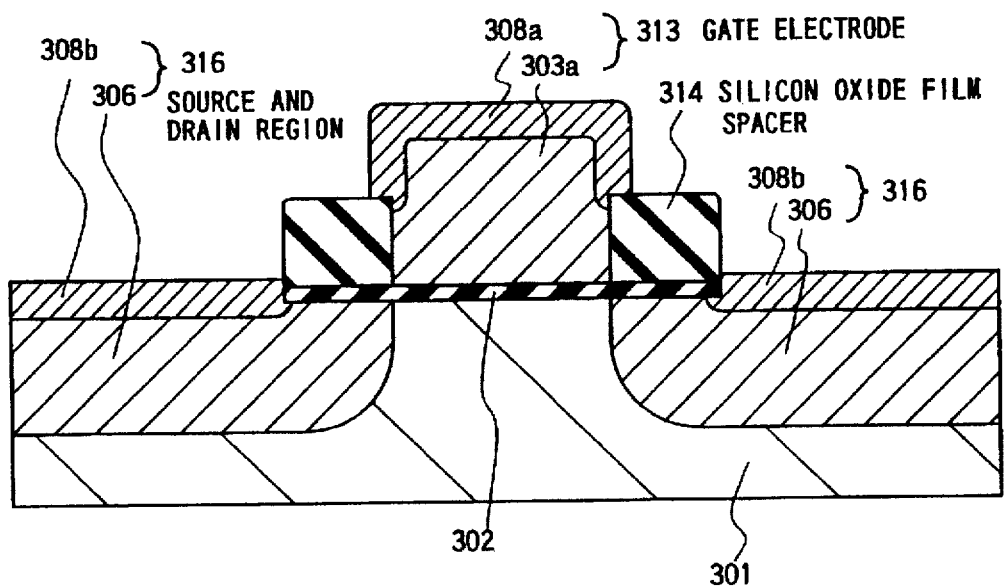
FIG. 2 is a schematic cross sectional view showing the conventional semiconductor device.
Figure 3:
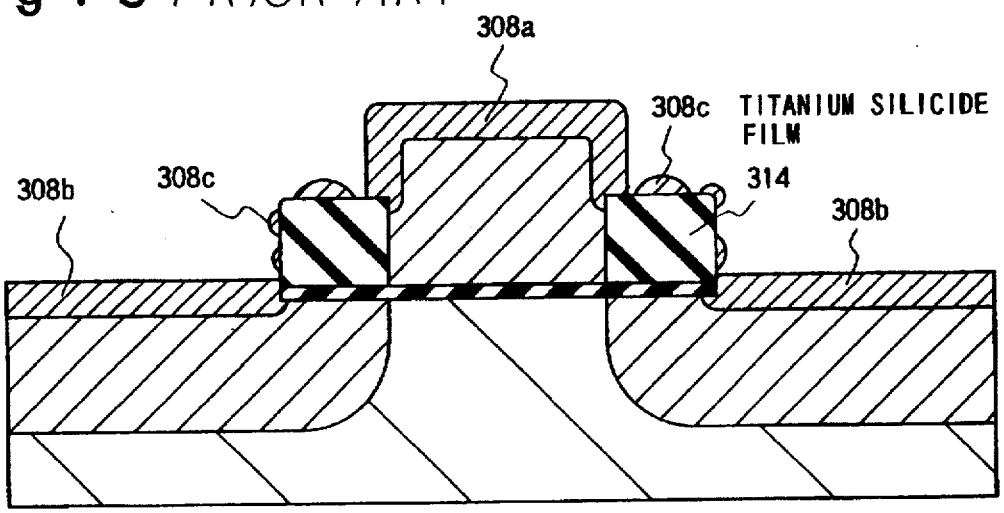
FIG. 3 is a schematic cross sectional view showing a problem in the conventional semiconductor device.
Figure 4:
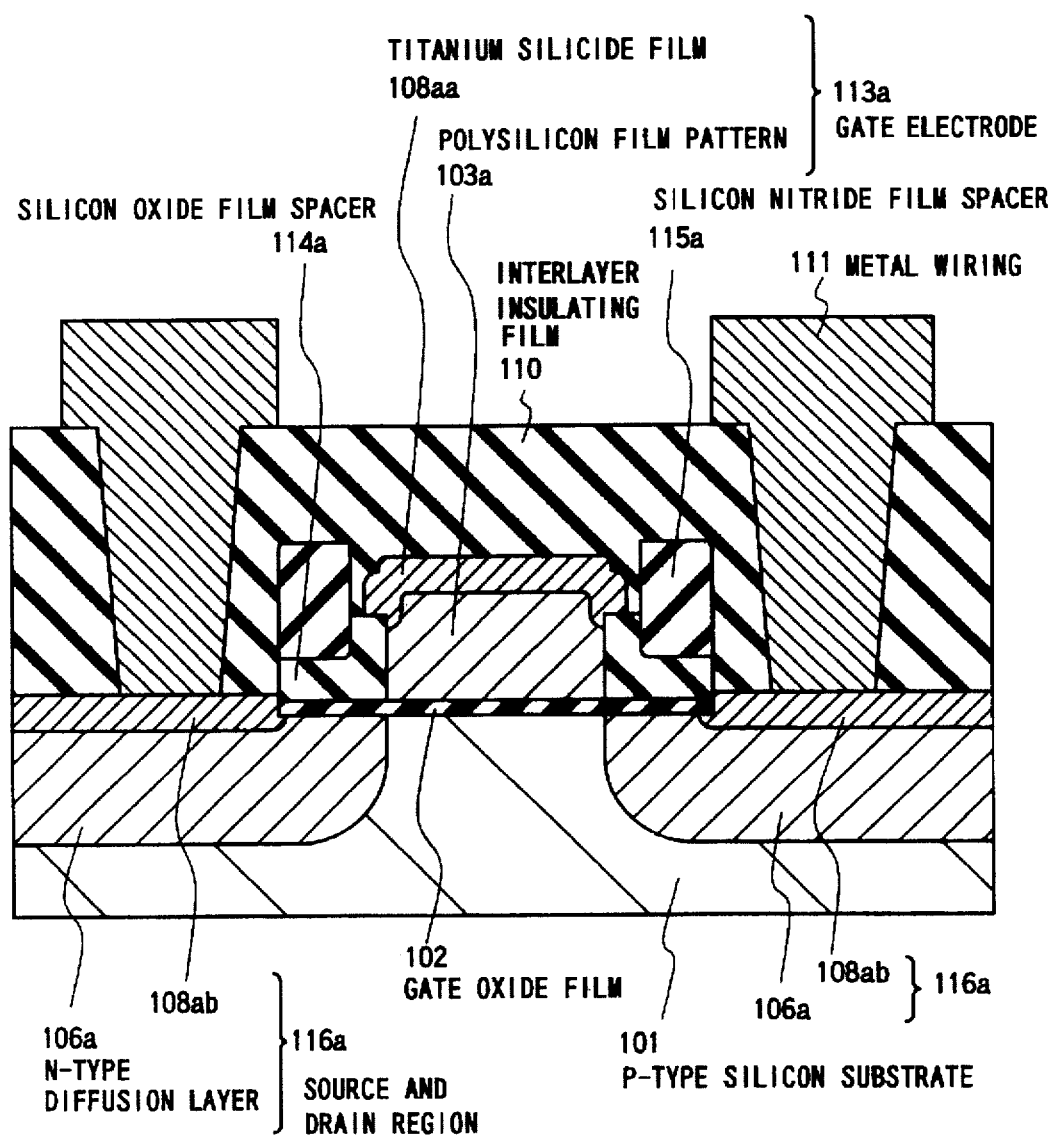
FIG. 4 is a schematic cross section view showing a semiconductor device according to a first embodiment of the present invention.

FIG. 4 is a schematic cross sectional view showing a semiconductor device according to a first embodiment of the present invention. The semiconductor device of the first embodiment is an n-channel MOS transistor having a silicide structure which includes a titanium silicide film. The MOS transistor according to the present embodiment which is composed of a gate insulating film 102, gate electrode 113a, silicon oxide film spacers 114a, silicon nitride film spacers 115a and source and drain regions 116a is covered with an interlayer insulating film 110. Contact holes are provided in the interlayer insulating film 110 to reach the source and drain regions 116a and metal wirings 111 are connected to the source and drain regions 116a through the contact holes.

A p-type silicon substrate 101 is provided with the n-type diffusion layers 106a having the junction depth of about 0.15 μm in the surface. Also, the silicon substrate 101 is provided with the gate insulating film 102 having the thickness of about 8 nm and a field insulating film (not shown) on the surface. The gate electrode 113a is formed on the p-type silicon substrate 101 via the gate insulating film 102. The gate electrode 113a is constituted as a lamination film of the n-type polysilicon film pattern 103a having the film thickness (height) of about 260 nm and the width of about 350 nm in a gate direction (gate length) and the titanium silicide film 108aa covering the polysilicon film pattern 103a and having the film thickness of about 80 nm. The insulating film spacer structure having a lamination structure is formed on each of the side surfaces of the gate electrode 113a in contact with the gate electrode 113a to have the bottom surface width of about 180 nm.

The insulating film spacer structure is formed of the silicon oxide film spacers 114a as first insulating film spacers and the silicon nitride film spacers 115a as second insulating film spacers. Each of the silicon oxide film spacers 114a has the cross section of a L-liked shape and has the film thickness of about 100 nm and the height of about 200 nm. Therefore, the top surface of the silicon oxide film spacer is lower than that of the polysilicon film pattern 103a by about 60 nm. The silicon oxide film spacers 114a are directly contact with the gate insulating film 102 in the bottom surface, if it is remained in etching, to cover a part of gate insulating film 102. Also, the silicon oxide film spacers 114a are directly contact with the side surface of the polysilicon film pattern 103a in a part of the side surface of each of the silicon oxide film spacers on the side of the gate electrode 113a, i.e., to the height of about 160 nm from the bottom of each of the silicon oxide film spacers 114a to cover the side surface of polysilicon film pattern 103a. Further, the silicon oxide film spacers 114a are directly contact with the titanium silicide film 108aa in the remaining part of the side surface of each silicon oxide film spacer, i.e., to the length of about 40 nm from the top surface of the silicon oxide film spacer, and in a part of the top surface of each silicon oxide film spacer, i.e., the width of about 40 nm on the side of gate electrode 113a. Each of the silicon nitride film spacer 115a has the width of about 80 nm and the height of about 300 nm. Therefore, the top surface of the silicon nitride film is at about 400 nm in high from the gate insulating film while that of the titanium silicide film is at about 340 nm. The top surface of each of the silicon nitride film spacer 115a is higher than that of the gate electrode 113a by about 60 nm. Each of the silicon nitride film spacer 115a is directly contact with one of the silicon oxide film spacers 114a in the bottom surface of the silicon nitride film spacer and a part of the side surface of the silicon nitride film spacer on the side of gate electrode to the height of about 100 nm from the bottom surface of the silicon nitride film spacer 115a. This side surface of the silicon nitride film spacer 115a is not directly contact with the gate electrode 113a, i.e., apart from the gate electrode 113a. A separation distance from the first titanium silicide film 108aa to the titanium silicide film 108ab along the surface of the spacer structure is about 680 nm which is 1.94 times longer than the gate length of about 350 nm. Since the separation distance is more than the gate length of 350 nm, the good result was obtained. It should be noted that the spacer structure may surround the gate electrode or is provided only on the sides of the source and drain regions.

The titanium silicide films 108ab are formed on a part of the n-type diffusion layers 106a in self-alignment with the silicon oxide film spacers 114a to have the film thickness of about 80 nm. These n-type diffusion layers 106a and titanium silicide films 108ab constitute source and drain regions 116a.

In the above semiconductor device in the first embodiment, the manufacturing processes of which will be described later, the polysilicon film pattern and the titanium film have the film thicknesses of about 300 nm and about 100 nm, respectively, in the stage before the titanium silicide films 108aa and 108ab are formed. In this stage, the top surface (height) of each of the silicon oxide film spacers 114a is lower than that of the polysilicon film pattern by about 100 nm. As a result, a contact length between the titanium film and the polysilicon film in the direction of channel length or gate length is about 550 nm and it is sufficiently longer than that of the gate length of about 350 nm, as in the MOS transistor produced based on a report (Thin solid Films, Vol. 198, pp.53–66, 1991). That is, the contact length is about 1.57 times longer than the gate length in this embodiment. Lamp annealing in a nitrogen ambient is performed at 650° C. for 30 seconds and then 850° C. for 10 seconds. In this manner, since the contact length in the direction of gate length is longer than the gate length, the titanium silicide films 108aa and 108ab formed through the lamp annealing is not condensed but has the C54 structure, resulting in the titanium silicide films having resistivity as low as about 15 µΩ.cm. It is preferable that the contact length is about 1.2 times or more longer than the gate length and in this case the titanium silicide film having the low resistivity could be achieved even if the design rule of gate or channel length shorter than 350 nm or below is applied.

Further, the semiconductor device in the first embodiment has the insulating film spacer structure which is composed of the silicon oxide film spacers 114a and the silicon nitride film spacers 115a. Therefore, the distance between the titanium silicide film 108aa as a part of the gate electrode 113a and the titanium silicide film 108ab as a part of the source or drain region 116a along the insulating film spacer structure having a lamination structure is made possible in principle to be elongated than that between the gate electrode and the source and drain regions along the insulating film spacer in the MOS transistor having the salicide structure in the above report. Further, it is easy to elongate the distance between the titanium silicide films longer than the distance between the gate electrode and the source and drain regions along an insulating film spacer in a conventional MOS transistor having a usual salicide structure, in which the film thickness of the gate electrode is approximately equal to that of the insulating film spacer. Therefore, in the semiconductor device in the present invention, the bridging phenomenon can be readily suppressed, i.e., a leakage current between the gate electrode and the source and drain regions can be reduced and generation of a short circuit can be suppressed, compared to the conventional MOS transistor having the usual salicide structure and the MOS transistor having the salicide structure based on the above report, as a matter of course.

It should be noted that although the first embodiment is applied to the n-channel MOS transistor, the present invention can be applied to various MOS-type transistor such as a p-channel MOS transistor, CMOS transistor, and BiCMOS transistor. In the p-channel MOS transistor, the conductive type of the polysilicon film pattern constituting a part of the gate electrode may be either p-type or n-type depending upon purposes. Further, in the first embodiment, the first insulating film spacer is composed of silicon oxide film and the second insulating film spacer is composed of the silicon nitride film. However, the present invention is not limited to this. The first and second insulating film spacers may be composed of the silicon nitride film and the silicon oxide film, respectively.

Next, a method of manufacturing the semiconductor device according to the first embodiment of the present invention will be described below with reference to FIGS. 5A to 5F.

Figure 5A:
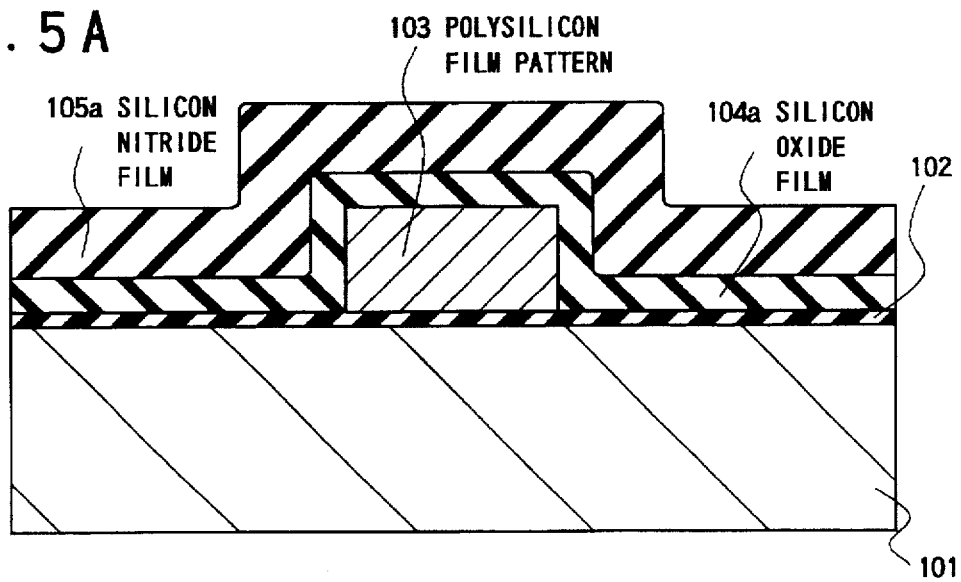
FIGS. 5A to 5F are schematic cross sectional views showing the manufacturing processes of the semiconductor device in the first embodiment.

First, referring to FIG. 5A, the field oxidation film (not shown) is formed on the surface of p-type silicon substrate 101 in element isolation regions. The gate insulating film 102 is formed on the surface of p-type silicon substrate 101 in an element forming region by a thermal oxidization method to have the film thickness of about 8 nm. After being formed on the whole surface to have the thickness of about 300 nm as a first film thickness, an n-type polysilicon film is patterned so that the polysilicon film pattern 103 is formed to have the line length (gate length) of about 350 nm. Subsequently, by a chemical vapor deposition (CVD) method, the silicon oxide film 104a and silicon nitride film 105a are sequentially formed on the whole surface in this order to have the film thickness of about 100 nm as a second film thickness and the film thickness of about 80 nm as a third film thickness, respectively.

Figure 5B:
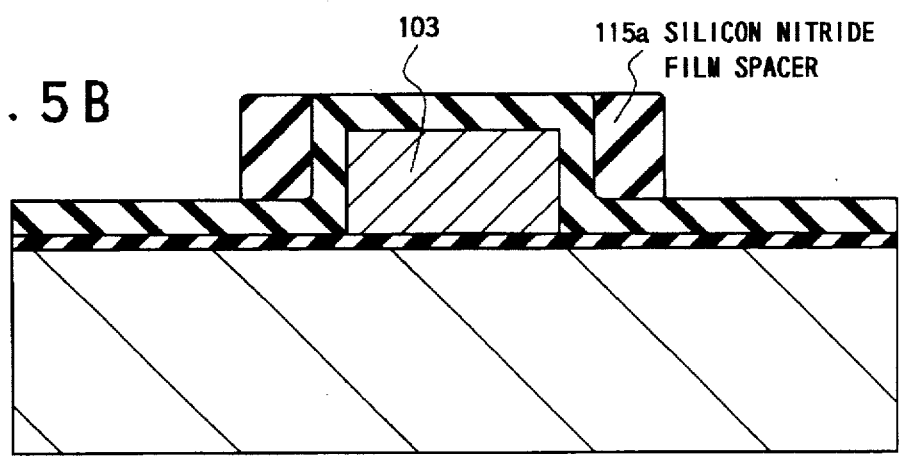

Next, as shown in FIG. 5B, the silicon nitride film 105a is etched back by an anisotropic etching method using trifluoromethane ($CHF_3$) gas and sulfur hexafluoride ($SF_6$) gas as etching gas (first etching back) to form the silicon nitride film spacers 115a. That selectivity of the silicon nitride films 105a in relation to the silicon oxide film 104a can be increased is because the sulfur hexafluoride ($SF_6$) is added. The height of each silicon nitride film spacer 115a is as high as about 300 nm which is approximately equal to the film thickness of the polysilicon film pattern 103.

Figure 5C:
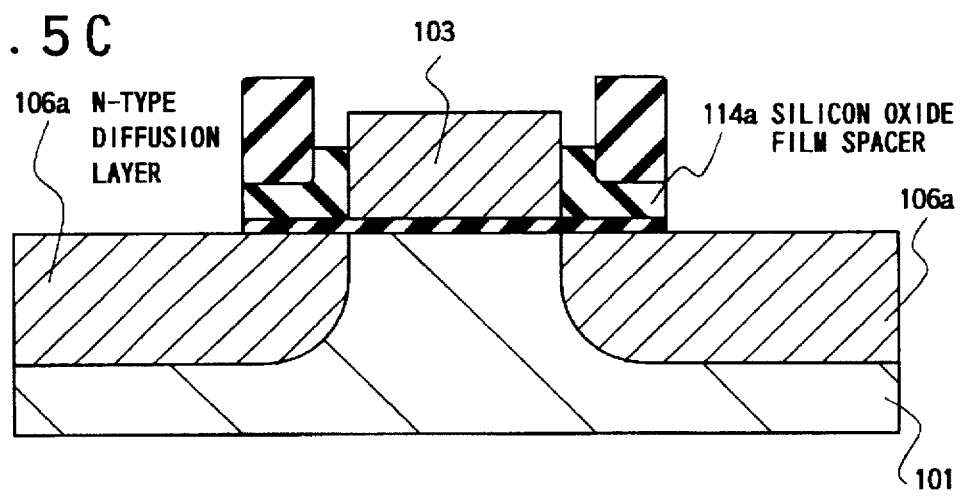

Next, as shown in FIG. 5C, in order to form the silicon oxide film spacers 114a having the L-liked shape, an anisotropic etching method is performed using, for example, a mixture of $CHF_3$ gas and carbon monoxide (CO) gas as etching gas so that the silicon oxide film 104a and the gate insulating film 102 are selectively etched back (second etching back). In this case, a mixture of fluorocarbon gas such as $C_2F_4$, $C_3F_6$ and $C_4F_8$ other than $CHF_3$ mentioned above and CO gas may be used as the etching gas. The silicon oxide film 104a and the gate insulating film 102 is overetched to a some extent. For instance, the etching is continued until the top surface of each of the silicon oxide film spacers 114a is lower than that of the polysilicon film spacer 103 by about 100 nm and as a result of this the silicon oxide film spacer 114a has a predetermined height, e.g., about 200 nm in this embodiment. Through this etching back the surface of a predetermined region of the p-type silicon substrate 101 is exposed. Subsequently, ion injection of arsenic (As) ions is performed using the polysilicon film pattern 103, silicon oxide film spacer 114a and silicon nitride film spacer 115a as a mask, so that the n-type diffusion layers 106a are formed to have the junction depth of about 0.15 µm for example. It should be noted that after the polysilicon film pattern 103 is formed, ion injection of arsenic (As) or phosphorus (P) ions may be carried out. Further, in a case where the present invention is applied to the formation of CMOS transistor, it is desirable that boron difluoride ($BF_2$) ion injection is carried out to form source and drain regions of a p-channel MOS transistor after arsenic ion injection and thermal pushing-in are carried out to form source and drain regions of an n-channel MOS transistor.

Figure 5D:
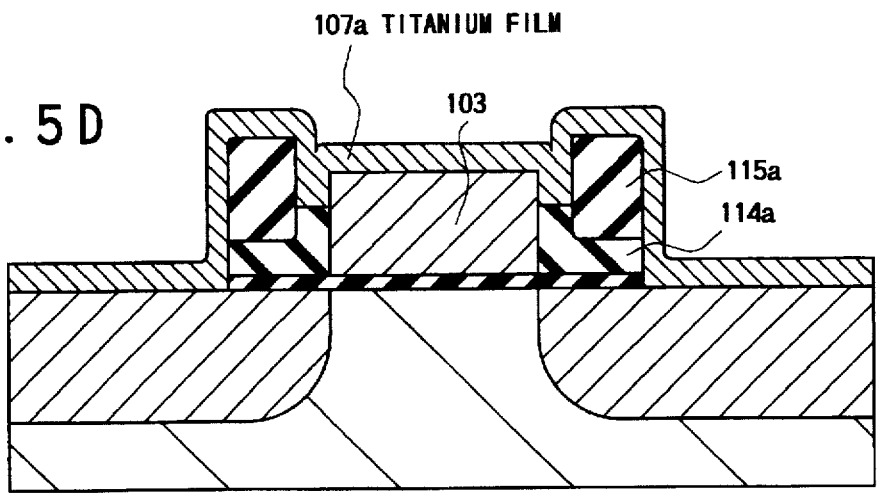

Next, as shown in FIG. 5D, the titanium film 107a is formed on the whole surface to have the film thickness of about 50 nm as a fourth film thickness in a flat portion. The titanium film 107a has the film thickness of about 25 nm on the side surface of the silicon nitride film spacer 115a on the side opposite to the polysilicon film pattern 103. The gap between the silicon nitride film spacer 115a and polysilicon film pattern 103 straightly on the silicon oxide film spacer 114a is filled with the titanium film 107a. The top surface of the titanium film 107a on the polysilicon film pattern 103 is lower than the top surface of the silicon nitride film spacer 115a by about 50 nm (=(the film thickness of the silicon oxide film 104a, 100 nm)−(the film thickness of the titanium film 107a, 50 nm)). A length of the polysilicon film 103 which contacts with the titanium film 107a, i.e., a contact width is as long as about 550 nm in a width direction of the polysilicon film 103 which is a gate length direction or a channel direction.

Figure 5E:
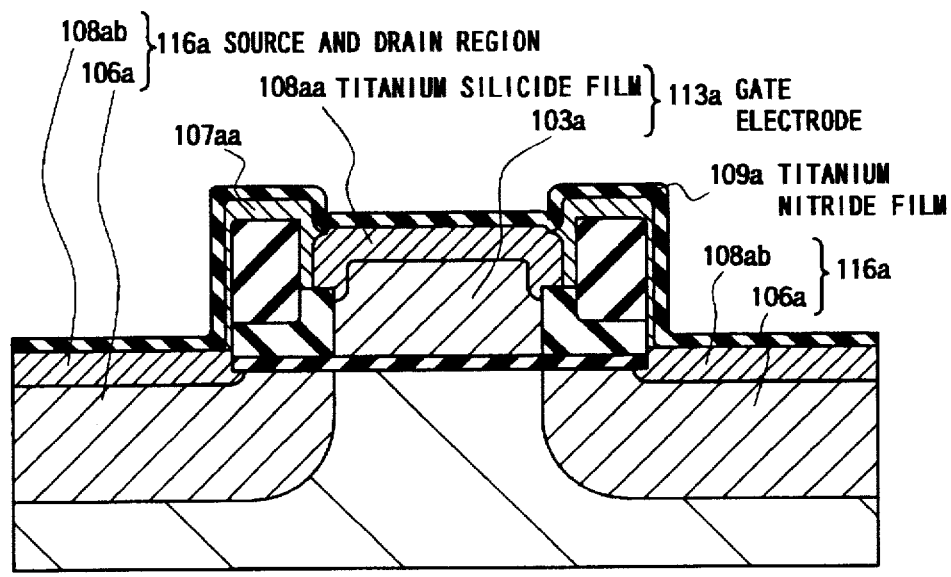

Next, as shown in FIG. 5E, lamp annealing is performed in a nitrogen ambient at 650° C. for 30 seconds and 850° C. for 10 seconds in this order. Through this heat treatment, the titanium silicide films 108aa and 108ab having the thickness of about 80 nm and the titanium nitride films 109a having the thickness of about 20 nm are formed, so that the polysilicon film pattern 103 changes to a polysilicon film pattern 103a having the thickness of about 260 nm and a titanium film 107aa is remained. As a result, a gate electrode 113a composed of the polysilicon film pattern 103a and the titanium silicide film 108aa and source and drain regions 116a composed of the n-type diffusion layers 106a and the titanium silicide films 108ab are formed.

Since the contact width between the polysilicon film pattern 103 and the titanium film 107a is elongated to about 550 nm, the titanium silicide film 108aa having the C54 structure can be obtained through the above heat treatment. The contact width of about 550 nm is longer than the gate length of about 350 nm by about 200 nm and about 1.57 (=550/350) times the gate length in this embodiment. In this manner, the contact width is preferably about 1.2 times or more longer than the gate length. It greatly contributes to this elongation that the top surfaces of the silicon oxide film spacers 114a are lower than that of the polysilicon film pattern 103. Titanium silicide films would be locally formed on the surfaces of silicon nitride film spacers 115a with a probability distribution through the heat treatment. However, the top surfaces of the silicon nitride film spacers 115a are higher than that of the polysilicon film spacer 103 so that the effective distance between the titanium silicide film 108aa and the titanium silicide film 108ab is elongated along the surface of silicon nitride film spacer 115a and the surface of silicon oxide film spacer 114a. That is, the effective distance is about 700 nm in this embodiment. Therefore, a bridging phenomenon can be almost completely suppressed compared to a MOS transistor having the conventional structure. Further, since the film thickness of the titanium film 107a is thinner than that of the silicon oxide film 104a, the top surfaces of the silicon nitride film spacers 115a become higher than that of the titanium film 107a which is on the polysilicon film pattern 103. Therefore, the top surface of silicon nitride film spacer 115a and the surface of silicon oxide film spacer 114a for separating the titanium silicide film 108aa and the titanium silicide films 108ab from each other has the surface on the side of the gate electrode 113a and the surface on the side of the source or drain region 116a. A probability that titanium silicide films which are individually and locally formed on the respective side surfaces are connected to one after another is lower than a probability that titanium silicide films which are locally formed on the same surface are connected to one after another. As a result, in the present embodiment, the bridging phenomenon can be further suppressed than the case where the titanium silicide film 108aa and the titanium silicide films 108ab are simply separated apart from each other.

The reason why the lamp annealing is performed at 650° C. is as follows. That is, in a case where the lamp annealing is first performed at 850° C., the bridging phenomenon is made active because the reaction rate of formation of silicide is high. Therefore, it is made difficult to achieve the object, i.e., the suppression of the bridging phenomenon. Hence, the formation of silicide is performed first by the heat treatment at a relatively low temperature so that the titanium silicide film having the C49 structure is formed and then the titanium silicide film having the C49 structure is changed to the titanium silicide film having the C54 through the heat treatment at a relatively high temperature.

Figure 5F:
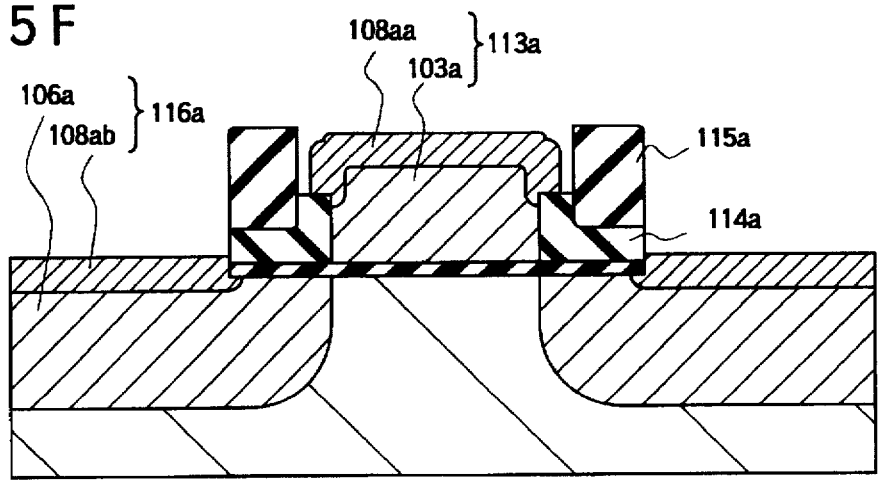

Next, as shown in FIG. 5F, the titanium film 107aa and the titanium nitride film 109a are selectively etched with hydrogen peroxide ($H_2O_2$) solution to which ammonia ($NH_4OH$) may be added, if desired. In this manner, the MOS transistor is completed in the present embodiment. Thereafter, the flattening of the surface of MOS transistor is carried out through the formation of tetraethoxysilane (TEOS) BPSG film and mechanically chemical polishing (MCP) and then an interlayer insulating film 110 is formed. Subsequently, after contact holes are formed in the interlayer insulating film 110 to reach the source and drain regions 116a, metal wirings 111 of aluminium-silicon-copper alloy films are formed using, for example, a titanium film and a titanium nitride film as barrier films.

It should be noted that the present invention is not limited to the values described in the first embodiment such as the film thickness of the gate oxidation film 102, the film thickness and line width of the polysilicon film pattern 103, the film thicknesses of the polysilicon film pattern 103a and the silicon oxide film 104a, the height and width of the silicon oxide film spacer 114a, the film thickness of the silicon nitride film 105a, the junction depth of the n-type diffusion layers 106a, the film thickness of the titanium film 107a, the temperature and time period of the lamp annealing, the film thicknesses of the titanium silicide film 108aa and 108ab, and the film thickness of the titanium nitride film 109a.

Next, the MOS transistor according to the second embodiment of the present invention will be described. The MOS transistor in the second embodiment has a similar structure to that in the first embodiment but manufactured by different processes. The method of manufacturing the MOS transistor of the second embodiment of the present invention will be described below with reference to FIGS. 6A to 6E. The manufacturing processes of the MOS transistor in the second embodiment is different from those in the first embodiment in the formation of titanium film and titanium silicide film.

In the second embodiment, in a similar manner to the first embodiment, a gate oxidation film 102 is formed on a p-type silicon substrate 101 and a polysilicon film pattern 103 is formed on the gate oxidation film 102. A silicon nitride film spacer 115b which is composed of a silicon nitride film having the third film thickness of about 80 nm, and a silicon oxide film spacer 114b which is composed of a silicon oxide film having the second film thickness of about 100 nm and the height of a predetermined value, for example about 250 nm in this example, are formed on the side surface of the polysilicon film pattern 103 and then n-type diffusion layers 106b are formed.

The shape and size of the n-type diffusion layers 106b, silicon oxide film spacer 114b, and silicon nitride film spacer 115*b* in the second embodiment are the same as those of the n-type diffusion layers 106*a*, silicon oxide film spacer 114*a*, and silicon nitride film spacer 115*a* in the first embodiment. The top surface of the silicon nitride film spacer 115*b* is higher by about 100 nm than that of the polysilicon film pattern 103 which has the film thickness of about 300 nm as the first film thickness and the top surface of the silicon oxide film spacer 114*b* is lower than that of the polysilicon film pattern 103 by about 100 nm.

Figure 6A:
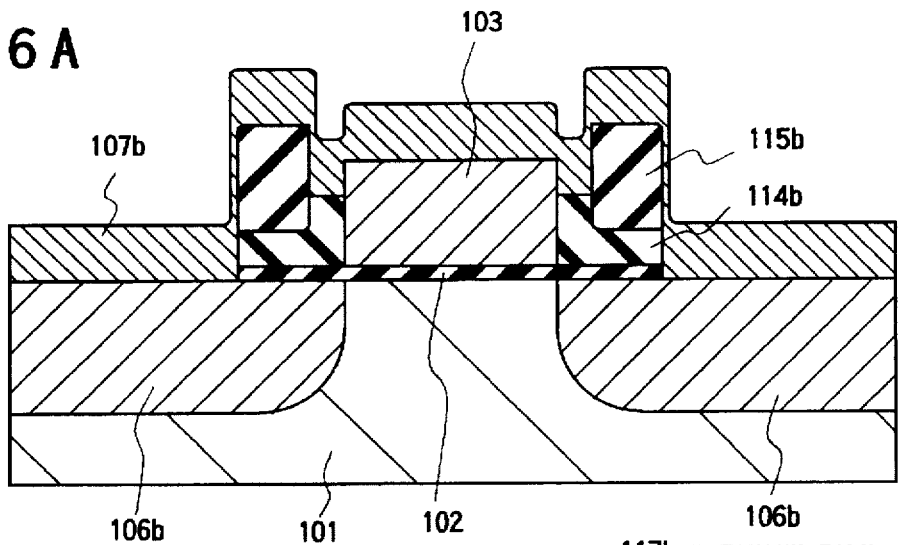
FIGS. 6A to 6E are schematic cross sectional views showing the manufacturing processes of the semiconductor device according to the second embodiment of the present invention.

Next, as shown in FIG. 6A, a titanium film 107*b* having the film thickness of about 100 nm on the flat portion as the fourth film thickness is formed by a collimated sputtering method. The contact width between the titanium film 107*b* and the polysilicon film pattern 103 is about 550 nm in long, which is about 1.57 (=550/350) times the gate length. The film thickness of the titanium film 107*b* is at most about 10 nm on the side surface of the silicon nitride film spacer 115*b* on the side opposite to the side of the polysilicon film pattern 103 and this value is about ⅒ of the film thickness in the flat portion. The description on the film thickness of the titanium film 107*b* will be given in the next process.

Figure 6B:
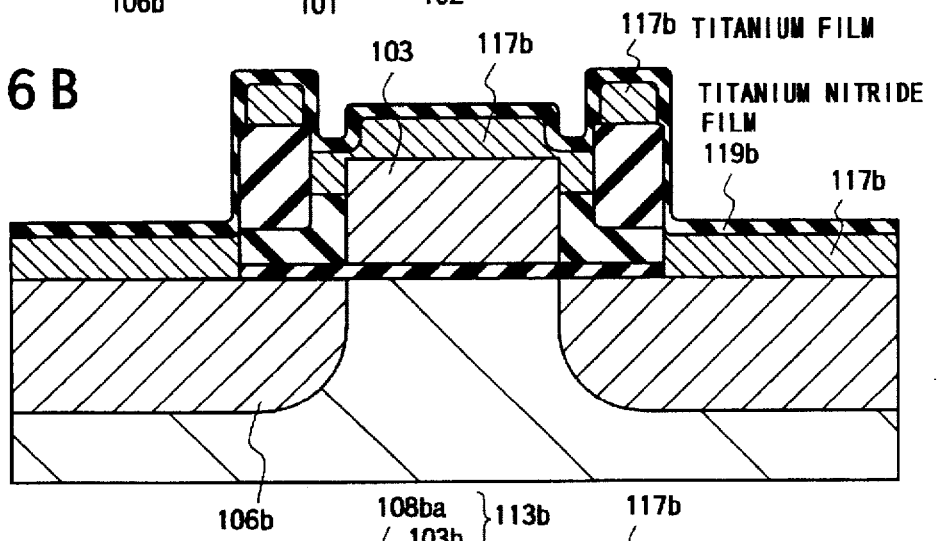

Next, as shown in FIG. 6B, the surface of titanium film 107*b* is plasma-nitrided with mixed gas of nitrogen ($N_2$) gas and ammonia ($NH_3$) gas under a condition of temperature of about 350° C. and pressure of about 13 Pa to form in the flat portion a titanium nitride film 119*b* having the film thickness of about 20 nm as the fifth film thickness. As a result of the plasma-nitriding the titanium film 117*b* is remained. It is desirable for the titanium film 107*b* to have the fifth film thickness such that the titanium film 107*b* is completely nitrided on the side surface of the silicon nitride film spacer 115*b* opposite to the gate electrode. This is because the formation of titanium silicide film is prevented or suppressed by the nitride film. Under the condition, the film thickness of the titanium nitride film 119*b* is thinner than a between in height the top surface of the silicon nitride film 115*b* and that of the silicon oxide film spacer 114*b*, i.e., ((the first film thickness)+(the second film thickness)−(a predetermined value, e.g., 260 nm)), the remained titanium film 117*b* covering the polysilicon film pattern 103 is completely separated from the remained titanium films 117*b* on the surface of n-type diffusion layers 106*b*. In this case, the separation distance is about 680 nm. The difference between the fourth film thickness and the fifth film thickness which is approximately equal to the film thickness of the titanium film 117*b* remained on the flat portion is desirably greater than the difference between the first film thickness and the predetermined value. In this case, the remained titanium film 117*b* covering the polysilicon film pattern 103 is not separated from the remained titanium film 117*b* on a part of the side surface of the polysilicon film pattern 103 which is not directly covered by the silicon oxide film spacer 114*a*.

Figure 6C:
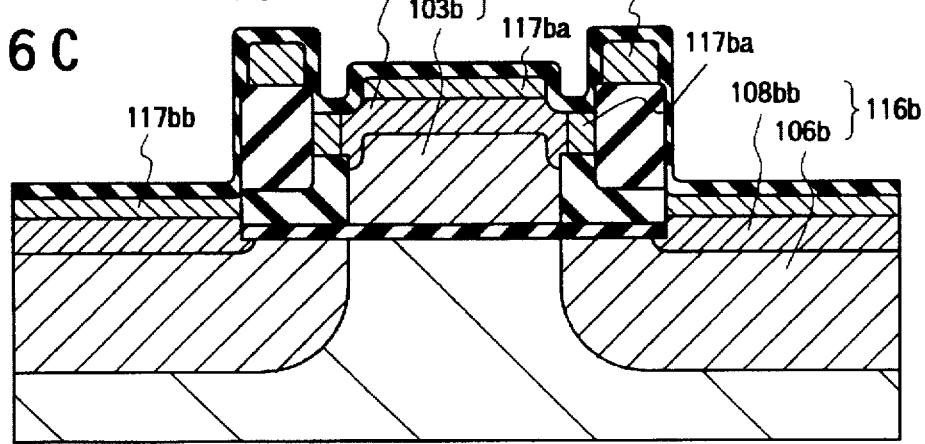

Next, as shown in FIG. 6C, lamp annealing is performed in an inert ambient such as argon or helium at 650° C. for 30 seconds and 850° C. for 10 seconds in this order. That the lamp annealing is performed in the argon or helium ambient is for the purpose of avoiding the formation of titanium nitride film through the heat treatment. Through this heat treatment, the titanium silicide films 108*ba* and 108*bb* having the thickness of about 80 nm are formed, so that the polysilicon film pattern 103 is changed to a polysilicon film pattern 103*b* having the thickness of about 260 nm. Also, a titanium film 107*ba* is remained between the titanium silicide film 108*ba* and the titanium nitride film 119*b* and the titanium film 117*bb* is remained between the titanium silicide film 108*bb* and the titanium nitride film 119*b*. As a result, a gate electrode 113*b* composed of the polysilicon film pattern 103*b* and the titanium silicide film 108*ba* and source and drain regions 116*b* composed of the n-type diffusion layers 106*b* and the titanium silicide films 108*bb* are formed.

The reason why the two steps of lamp annealing is performed will be described below. The single step of lamp annealing at the higher temperature is sufficient if attention is paid to the bridging phenomenon between the gate electrode and the source and drain regions in single MOS transistor. However, the two steps of lamp annealing is preferable as described above if the attention is paid to the bridging phenomenon between the source of a MOS transistor and the drain of another MOS transistor provided adjacent to the MOS transistor via the field insulating film.

Figure 6D:
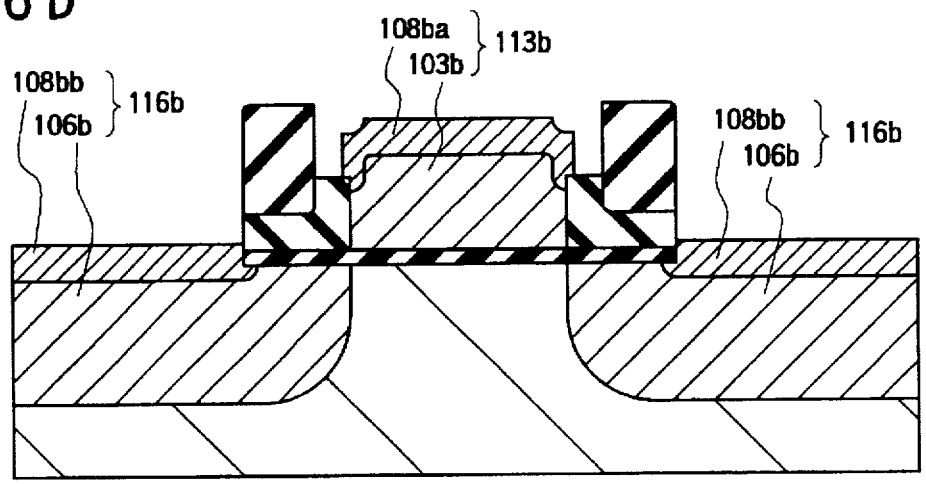
Figure 6E:
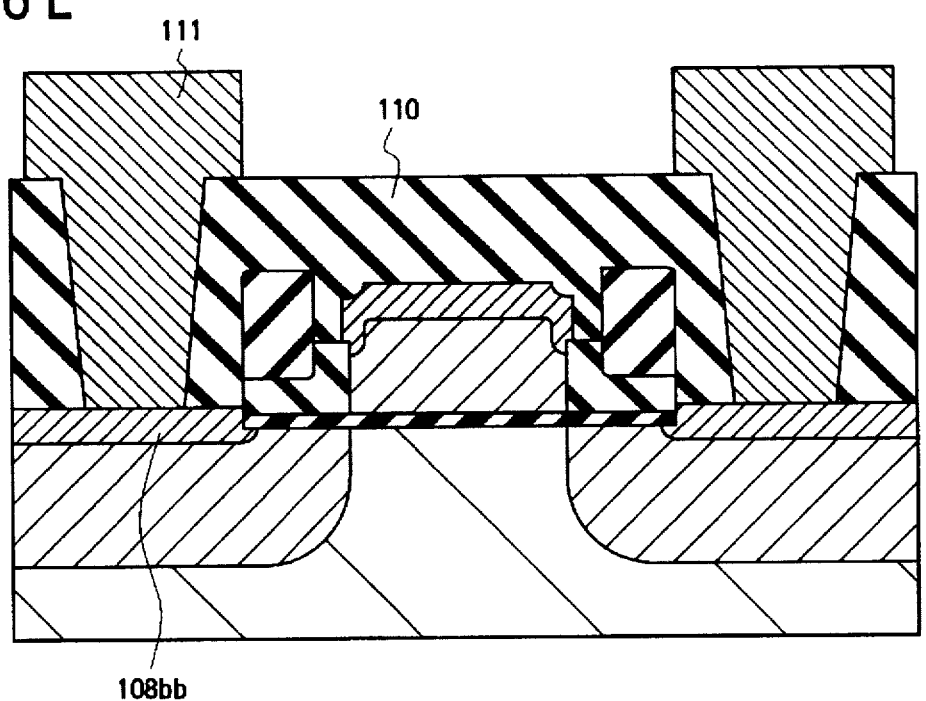

Next, as shown in FIG. 6D, the titanium nitride film 119*b* and the titanium films 117*b*, 117*ba* and 117*bb* are removed in the same manner in the first embodiment. As a result the MOS transistor according to the present embodiment is completed. Thereafter, an interlayer insulating film 110, contact holes and metal wirings 111 are formed in the same manner as in the first embodiment, as shown in FIG. 6E.

The MOS transistor in the second embodiment has the same advantage as that in the first embodiment. Further, in the second embodiment, since the formation of titanium film by the collimated sputtering method and the formation of titanium nitride film on the surface of titanium film at a relative low temperature by a plasma nitriding method, the bridging phenomenon can be substantially completely prevented between the gate electrode and the source and drain regions in the same MOS transistor, unlike the first embodiment.

It should be noted that the present invention is not limited to the values described in the second embodiment such as the film thickness and line width of the polysilicon film pattern 103, the film thicknesses of the polysilicon film pattern 103*b*, the height and width of the silicon oxide film spacer 114*b*, the junction depth of the n-type diffusion layers 106*a*, the film thickness of the titanium film 107*b*, the temperature and pressure of the plasma nitriding, the temperature and time period of the lamp annealing, the film thicknesses of the titanium film 117*d* and titanium nitride film 119*b*, and the film thicknesses of the titanium silicide film 108*ba* and 108*bb*.

It should be noted that if the titanium film is formed by a collimated sputtering method in place of the normal sputtering in the first embodiment, the bridging phenomenon can be further suppressed in the first embodiment.

Next, the MOS transistor according to the third embodiment of the present invention will be described. The MOS transistor in the third embodiment is different from the MOS transistor in the first or second embodiment in that the silicon oxide film spacer and the silicon nitride film spacer are laterally provided on the silicon substrate. The method of manufacturing the MOS transistor according to the third embodiment is shown in FIGS. 7A to 7F.

First, referring to FIG. 7A, a field oxidation film (not shown) and a gate insulating film 102 is sequentially formed on the surface of a p-type silicon substrate 101. Then an n-type polysilicon film having the film thickness of about 300 nm as the first film thickness and a first silicon oxide film having the film thickness of about 200 nm are formed on the whole surface. These polysilicon film and first silicon oxide film are patterned using lithographic technique so that the polysilicon film pattern 103 on which the first silicon oxide film 154 is mounted is formed to have the line length (gate length) of about 350 nm. Subsequently, a second silicon oxide film 104c is deposited on the whole surface including the side surface of the polysilicon film pattern 103 to have the film thickness of about 100 nm as a second film thickness.

Next, as shown in FIG. 7B, the silicon oxide films 104c and 154 and the gate oxidation film 102 are selectively etched back by an anisotropic etching method using mixed gas of trifluoromethane ($CHF_3$) gas and carbon monooxide (CO) gas (the first etching back). As a result, a silicon oxide film 154c is remained on the polysilicon film pattern 103 to have the film thickness of about 100 nm as the third film thickness and silicon oxide film spacers 114c are formed in contact with the side surfaces of the polysilicon film pattern 103 and the silicon oxide film 154c to have the height of about 400 nm. Subsequently, a silicon nitride film 105c is formed on the whole surface to have the film thickness of about 80 nm as the fourth film thickness.

Next, as shown in FIG. 7C, the silicon nitride film 105c is selectively etched back by an anisotropic etching method using mixed gas of tetrafluoromethane ($CHF_4$) gas, hydrogen ($H_2$) gas, nitrogen ($N_2$) gas and monosilane ($SiH_4$) gas (the second etching back) so that silicon nitride film spacers 115c are formed to have the height of about 400 nm. The silicon nitride film spacers 115c are provided in contact with the silicon oxide film spacer 114c on the side opposite to the polysilicon film pattern 103 on the silicon substrate 101. In the present embodiment, the height of silicon nitride film spacer 115c may be set freely, different from the first and second embodiments, because it is not limited by the sum of or difference between the film thickness of polysilicon film pattern 103 and the film thickness of silicon oxide film 104c resulting in the silicon oxide film spacers 114c. The $SiH_4$ gas is added to the etching gas in this etching back to ensure not only the selectivity of the silicon oxide film but also the selectivity of the silicon nitride film 105c in relation to the silicon substrate. It should be noted that if a silicon oxide film is formed again at least on the exposed surface of the p-type silicon substrate 101 by, for example, a thermal oxidization method after the formation of the silicon oxide film spacers 114c, it is made possible to form silicon nitride film spacers by an anisotropic etching using mixed gas of the $CHF_3$ gas and the $SF_6$ gas as the etching gas, as in the first embodiment.

Next, a third etching back process is performed under the same condition as in the first etching back process. The silicon oxide film 154c is removed and the top surface of the silicon oxide film spacer 103 is exposed. At the same time, the silicon oxide film spacers 114c are changed into silicon oxide film spacers 114ca each having a predetermined height, e.g., about 200 nm in this embodiment. Subsequently, ion injection of arsenic (As) ions is performed using the polysilicon film pattern 103, silicon oxide film spacers 114ca and silicon nitride film spacer 115c as a mask, so that the n-type diffusion layers 106c are formed to have the junction depth of about 0.15 μm for example. It should be noted that the ion injection may be carried out immediately after the silicon nitride film spacers 115c or silicon oxide film spacers 114c are formed. In this embodiment, it is desirable that the top surface of the n-type diffusion layers 106c and the bottom surface of the silicon nitride film spacer 115c are completely overlapped to prevent the degradation of device characteristics due to injection of hot carriers because the bottom surface of the silicon nitride film spacer 115c is directly contact with the top surface of the p-type silicon substrate 101.

Note that the ion injection of arsenic (As) with a low density may be performed after the polysilicon film pattern 103 is formed. Further, in a case where the present invention is applied to a CMOS transistor, it is preferable that the source and drain regions of an n-channel MOS transistor are formed immediately after the silicon oxide film spacers 114c and the source and drain regions of a p-channel MOS transistor are formed immediately after the silicon oxide film spacer 114ca is formed.

Next, as shown in FIG. 7D, the titanium film 107c is formed on the whole surface to have the film thickness of about 50 nm as the fourth film thickness in a flat portion.

Next, as shown in FIG. 7E, lamp annealing is performed in a nitrogen ambient at 650° C. for 30 seconds and 850° C. for 10 seconds in this order. Through this heat treatment, the titanium silicide films 108ca and 108cb having the thickness of about 80 nm and the titanium nitride film 109c having the thickness of about 20 nm are formed, so that the polysilicon film pattern 103 is changed to a polysilicon film pattern 103c having the thickness of about 260 nm and a titanium film 107ca is remained. As a result, a gate electrode 113c composed of the polysilicon film pattern 103c and the titanium silicide film 108ca and source and drain regions 116c composed of the n-type diffusion layers 106c and the titanium silicide film 108cb are formed. In this case, the contact length between the titanium silicide film 108ca and the polysilicon film patter 103c is longer than 550 nm and 1.57 times or above longer than the gate length. Also, the separation length between the titanium silicide film on the polysilicon film patter and the titanium silicide film of the source or drain region is about 680 nm which is further greater than 350 nm.

Next, as shown in FIG. 7F, the titanium film 107ca and the titanium nitride film 109c are selectively etched, as in the first and second embodiments. Thereafter, an interlayer insulating film, contact holes and metal wirings 111 are formed.

The third embodiment has the same advantages as the first embodiment. The present embodiment is superior to the first embodiment in application to a CMOS transistor. It should be noted that the formation of a titanium film, the formation of a titanium nitride film on the titanium film by plasma nitriding, and the heat treatment in an argon or helium ambient which are all employed in the second embodiment may be applied to the present embodiment.

It should be noted that the present invention is not limited to the values described in the third embodiment such as the film thickness and line width of the polysilicon film pattern 103, the film thicknesses of the polysilicon film spacer 103c and the silicon oxide film 104c, the film thicknesses of the silicon oxide films 154 and 154c and silicon nitride film 105c, the height and width of the silicon oxide film spacer 114c, the junction depth of the n-type diffusion layers 106c, the film thicknesses of the titanium film 107c, titanium silicide films 108ca and 108cb, and titanium nitride film 109c.

Next, the MOS transistor according to the fourth embodiment of the present invention will be described. The MOS transistor in the fourth embodiment is different from the first to third embodiments in that the MOS transistor has a salicide structure of a three-layer insulating film spacer structure. The method of manufacturing the MOS transistor according to the fourth embodiment is shown in FIGS. 8A to 8F.

Figure 8A:
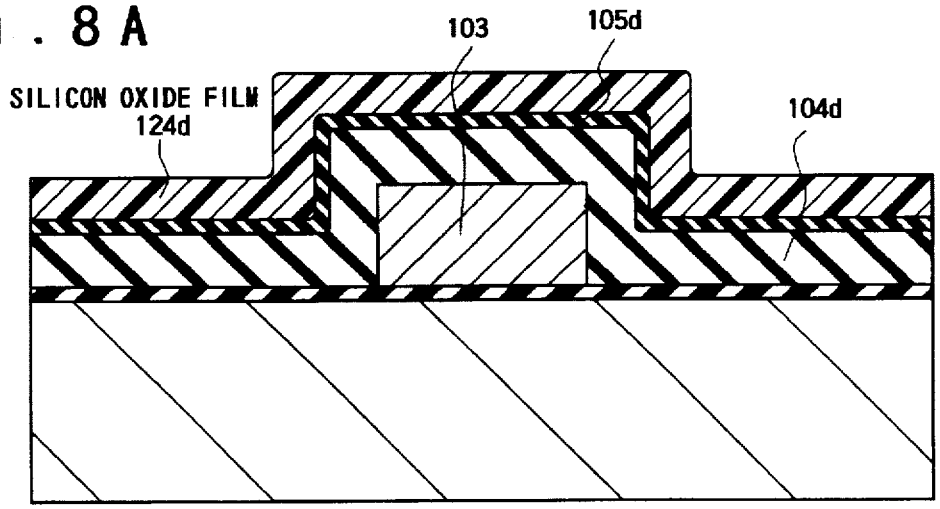
FIGS. 8A to 8F are schematic cross sectional views showing the manufacturing processes of the semiconductor device according to the fourth embodiment of the present invention.

First, referring to FIG. 8A, in the same manner as in the first embodiment, a gate insulating film 102 is formed on the surface of a p-type silicon substrate 101. Then a polysilicon film pattern 103 having the film thickness of about 300 nm and line length (gate length) of about 350 nm is formed on the gate insulating film 102. Subsequently, a first silicon oxide film 104d having the film thickness of about 70 nm as the second film thickness, a silicon nitride film 105d having the film thickness of about 50 nm as the third film thickness, and a second silicon oxide film 124d having the film thickness of about 60 nm as the fourth film thickness are sequentially formed on the whole surface by a CVD method.

Figure 8B:
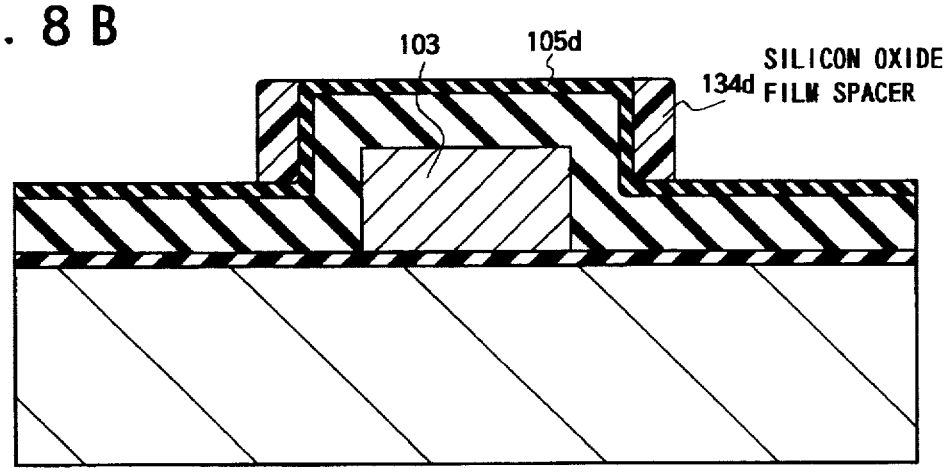

Next, as shown in FIG. 8B, the silicon oxide film 124d is selectively etched back by an anisotropic etching method using mixed gas of trifluoromethane ($CHF_3$) gas and carbon monooxide (CO) gas (the first etching back), until the top surface of the silicon nitride film 105d is exposed. As a result, silicon oxide film spacers 134d are formed at the corner portions of the silicon nitride film 105d. Each of the silicon oxide film spacers 134d has the height substantially equal to the film thickness of the polysilicon film pattern 103.

Figure 8C:
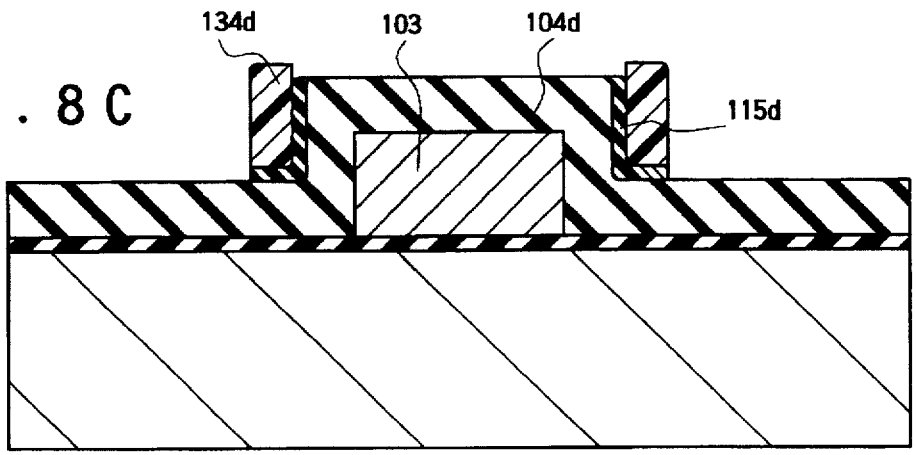

Next, as shown in FIG. 8C, the silicon nitride film 105d is selectively etched back by an anisotropic etching method using mixed gas of trifluoromethane ($CHF_3$) gas and $SF_6$ gas (the second etching back), until the top surface of the silicon oxide film 104d is exposed. As a result, silicon nitride film spacers 115d are formed at the corner portions of the silicon oxide film 104d with the silicon oxide film spacers 134d. Each of the silicon nitride film spacers 115d also has the height substantially equal to the film thickness of the polysilicon film pattern 103. The top surface of the silicon oxide film spacer 134d is higher than that of the silicon nitride film spacer 115d by about 50 nm.

Figure 8D:
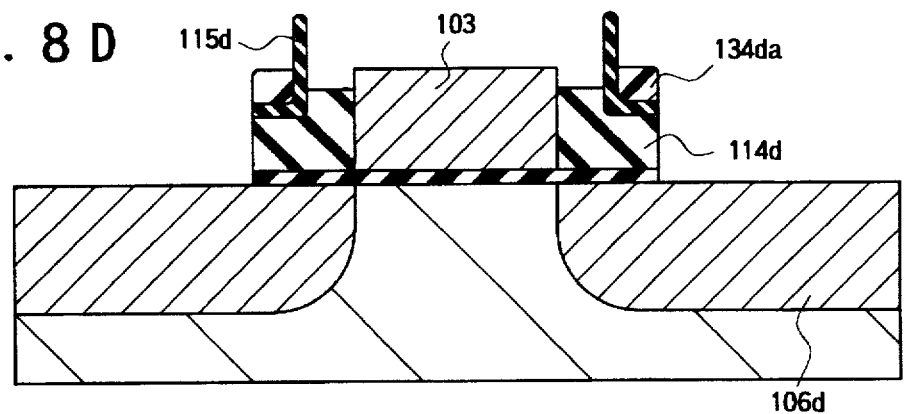

Next, as shown in FIG. 8D, the silicon oxide film 104d, silicon oxide film spacers 134d and gate insulating film 102 are selectively etched back by an anisotropic etching method using mixed gas of trifluoromethane ($CHF_3$) gas and carbon monooxide (CO) gas (the third etching back). Trough this etching back, the silicon oxide film 104d and silicon oxide film spacers 134d are respectively etched back by about 100 nm so that they are changed into silicon oxide film spacers 114d each having a predetermined height, e.g., about 270 nm and silicon oxide film spacers 134da each having a predetermined height, e.g., about 200 nm. As a result, the insulating film spacer structure can be obtained in which the silicon oxide film spacers having an L-liked shape on the gate insulating film 102 are contact with the side surfaces of the polysilicon film pattern 103 on the vertical side surfaces, the silicon nitride film spacers 115d are provided along the surfaces of silicon oxide film spacers 114d to have an L-liked shape, and the silicon oxide film spacers 134da are provided at the L-like shape corner portions of the silicon nitride film spacers 115d. In this state, the top surface of the silicon oxide film spacer 134da is lower than that of the silicon nitride film spacer 115d by about 50 nm. Also, the top surface of the silicon oxide film spacer 114d is lower than the top surfaces of the silicon nitride film spacer 115d and polysilicon film pattern 103 by about 100 nm and about 30 nm, respectively. Therefore, the separation distance is about 580 nm which is further greater than 350 nm. Subsequently, n-type diffusion layers 106d are formed to have a junction depth of, for example, 0.15 μm.

Figure 8E:
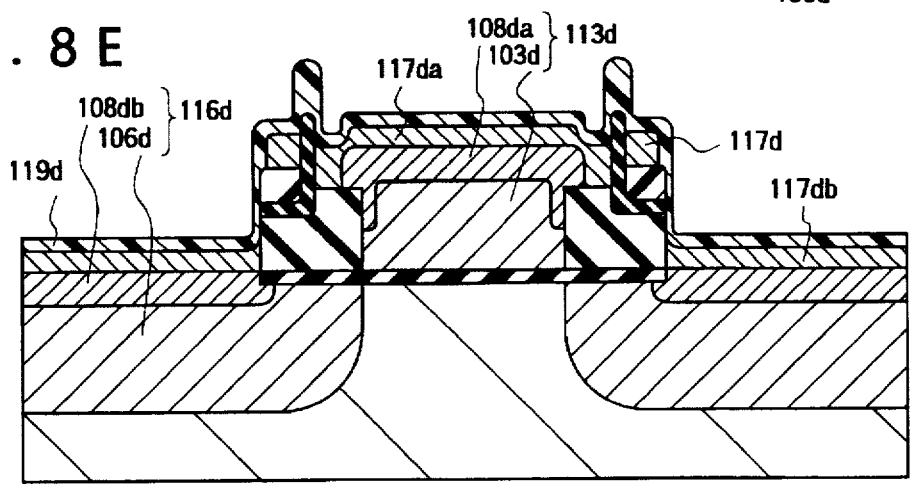

Next, as shown in FIG. 8E, a titanium film (not shown) is formed in the same method as in the above second embodiment to have the film thickness of about 80 nm as the fifth film thickness in a flat portion. The contact width of between the titanium film and the polysilicon film pattern 103 is about 410 nm in long, which is about 1.17 (=410/350) times the gate length. Subsequently, the surface of titanium film is plasma-nitrided by the same method as in the above second embodiment to form in the flat portion a titanium nitride film 119d having the film thickness of about 20 nm as the sixth film thickness. As a result of the plasma-nitriding the titanium film 117d is remained. Subsequently, lamp annealing is performed in the same manner as in the second embodiment, to form titanium silicide films 108da and 108db having the thickness of about 80 nm. As a result, the polysilicon film pattern 103 is changed to a polysilicon film pattern 103d having the thickness of about 260 nm. Also, the titanium film 117da is remained between the titanium silicide film 108da and the titanium nitride film 119d and the titanium film 117db is remained between the titanium silicide film 108db and the titanium nitride film 119d. As a result, a gate electrode 113d composed of the polysilicon film pattern 103d and the titanium silicide film 108da and source and drain regions 116d composed of the n-type diffusion layers 106d and the titanium silicide films 108db are formed.

Figure 8F:
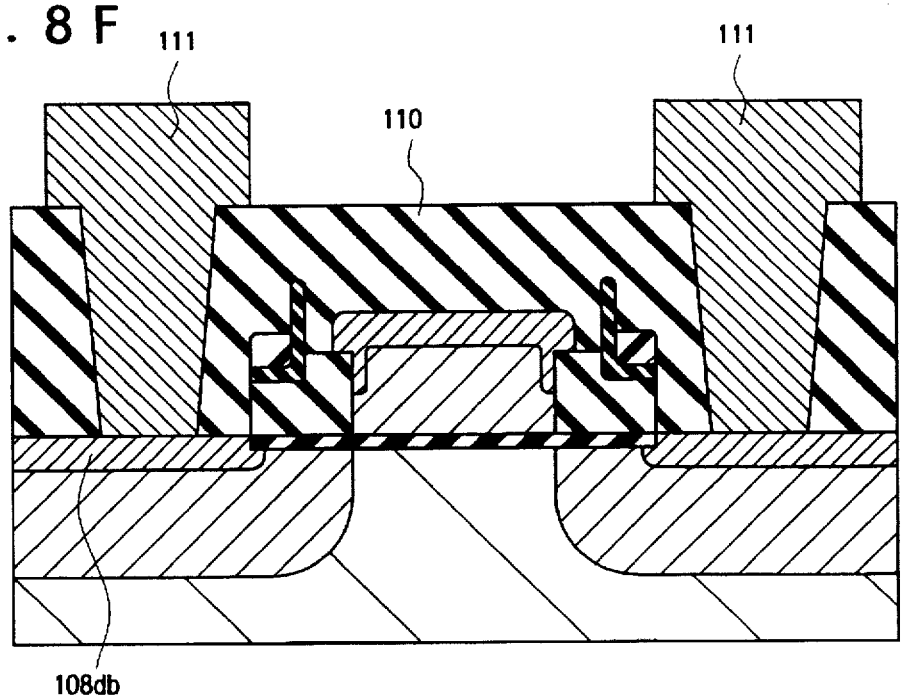

Next, as shown in FIG. 8F, the titanium films 117d, 117da and 117db and the titanium nitride film 119d are selectively etched, as in the first embodiment. Thereafter, an interlayer insulating film 110, contact holes and metal wirings are formed.

The fourth embodiment has the same advantages as the second embodiment. Further, in the present embodiment, the titanium film 117d covering the polysilicon film pattern 103 and the titanium film 117d covering the surface of the n-type diffusion layers 106d can be reliably separated from each other because the titanium nitride film 119d is formed on the side surface of the silicon nitride film spacer 115d and the side surface of the silicon oxide film spacer 134da in a state before the lamp annealing is performed, although the processes are more complicated than those in the second embodiment to some extent. As a result, in the present embodiment, the bridging phenomenon can be more surely and reliably suppressed than in the second embodiment. In addition, if the formation and heat treatment of the titanium film are performed in the same manner as in the first embodiment, a semiconductor device can be obtained which has the same advantages as the first embodiment.

It should be noted that the present invention is not limited to the values described in the fourth embodiment such as the film thickness and line width of the polysilicon film pattern 103, the film thicknesses of the polysilicon film spacer 103d, the silicon oxide film 104d and 124d, and silicon nitride film 105d, the height of the silicon oxide film spacer 114d, the junction depth of the n-type diffusion layers 106d, the film thicknesses of the titanium film at the time of formation, titanium silicide films 108da and 108db, and titanium nitride film 109d.

In the above first to fourth embodiments, in order to widen the contact width between the polysilicon film pattern and the titanium film wider than the line width (gate length) of the polysilicon film pattern without shortening the separation distance, there is employed a lamination insulating film spacer structure including at least the first shorter insulating film spacer and the second taller insulating film spacer.

Next, the MOS transistor according to the fifth embodiment of the present invention will be described below with reference to FIGS. 9A to 9I. In this embodiment, regardless that the insulating film spacer includes only the single layer, the contact width between the polysilicon film pattern and the titanium film is wider than the line width (gate length) of the polysilicon film pattern. The manufacturing processes of the MOS transistor according to the fifth embodiment will be described below.

Figure 9A:
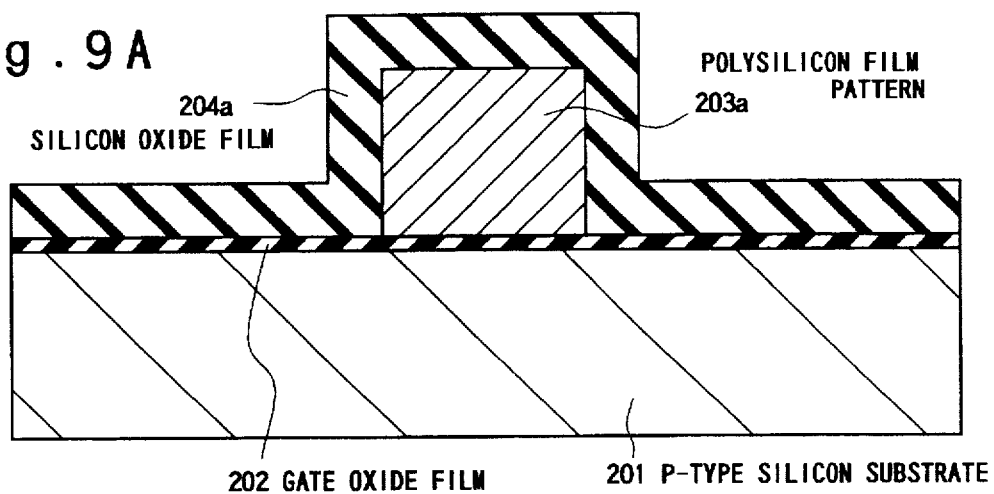
FIGS. 9A to 9I are schematic cross sectional views showing the manufacturing processes of the semiconductor device according to the fifth embodiment of the present invention.

First, referring to FIG. 9A, a field oxidation film (not shown) is formed on the surface of p-type silicon substrate 201 in element isolation regions. A gate insulating film 202 is formed on the surface of p-type silicon substrate 201 in an element forming region by a thermal oxidization method to have the film thickness of about 8 nm. After an n-type polysilicon film is formed on the whole surface to have the film thickness of about 400 nm, it is patterned so that a polysilicon film pattern 203a is formed to have the line length (gate length) of about 350 nm. Subsequently, by a chemical vapor deposition (CVD) method, a first silicon oxide film 204a is formed on the whole surface to have the film thickness of about 100 nm as a first film thickness.

Figure 9B:
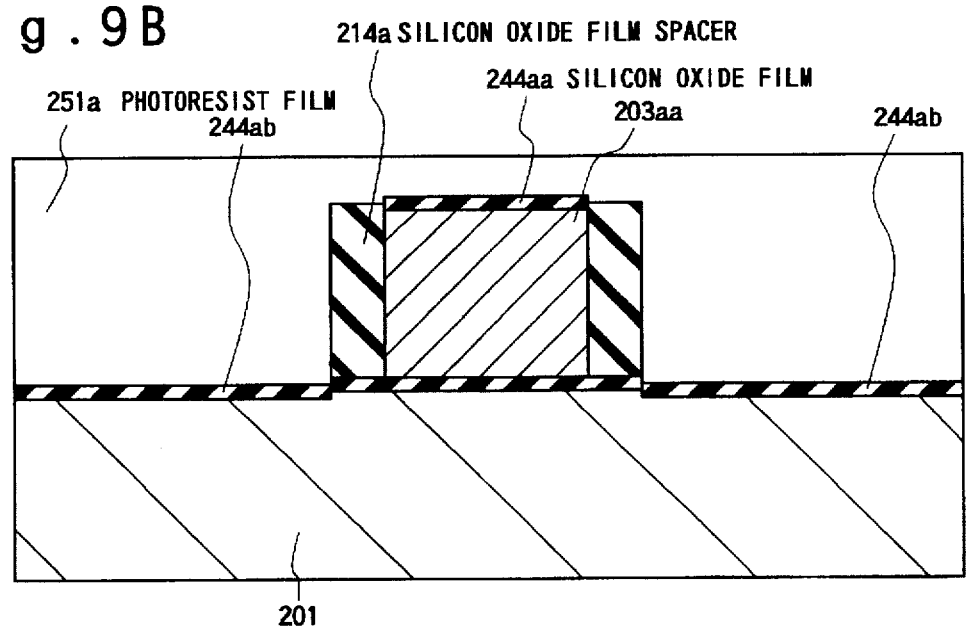

Next, as shown in FIG. 9B, the silicon oxide film 204a and the gate insulating film 202 are selectively etched back by an anisotropic etching method using trifluoromethane ($CHF_3$) gas and carbon monoxide (CO) gas as etching gas (first etching) to form the silicon oxide film spacer 214a to have the height of about 400 nm. Through the thermal oxidization the polysilicon film pattern 203a is changed into a polysilicon film pattern 203a a having the film thickness of about 390 nm as a second film thickness. A second silicon oxide film 244aa is also formed on the polysilicon film pattern 203aa to have the film thickness of about 20 nm and a third silicon oxide film 244ab having the film thickness of about 10 nm is also formed on a portion of the p-type silicon substrate 201 from which the gate insulating film 202 is removed. Subsequently, a photoresist film 251a is coated on the whole surface.

The reason why this photoresist film 251a is provided is that the above silicon oxide film 244ab is protected from a third etching back of a post process. Therefore, if the height of photoresist film 251a is uniform regardless of positions, the photoresist film 251a needs not necessarily cover the silicon oxide film 244aa. In this case, the next process as a second etching back can be omitted. However, it is difficult to make the height of the photoresist film 251a uniform regardless of positions and therefore it is preferable that the photoresist film 251a covers the silicon oxide film 244aa.

Next, the photoresist film 251a is selectively etched back by an anisotropic etching method (a second etching back) using a mixture of $CF_4$ gas and oxygen ($O_2$) gas as etching gas until at least the top surfaces of the silicon oxide film spacers 214a are exposed so that the photoresist film 251aa is remained. Subsequently, the silicon oxide film 244aa and the silicon oxide film spacers 244aa are selectively etched back by an anisotropic etching method (a third etching back) using a mixture of $CHF_3$ gas and carbon monooxide (CO) gas as etching gas until the top surfaces of the silicon oxide film spacers 203aa are completely exposed so that the silicon oxide film 244aa is completely removed and the silicon oxide film spacers 214a are changed into silicon oxide film spacers 214aa having the height of about 380 nm. It could be considered that the silicon oxide film 244aa and silicon oxide film spacers 214a are etched back subsequently to the etching back of the photoresist 251a by an anisotropic etching method using mixed gas of $CF_4$ gas, $O_2$ gas and $H_2$ gas as the etching gas, in other words, the second etching back and the third etching back is performed collectively as a single process. As described above, however, this method is nor preferable because it is difficult to make the height of the photoresist film 251a uniform regardless of positions.

Figure 9C:
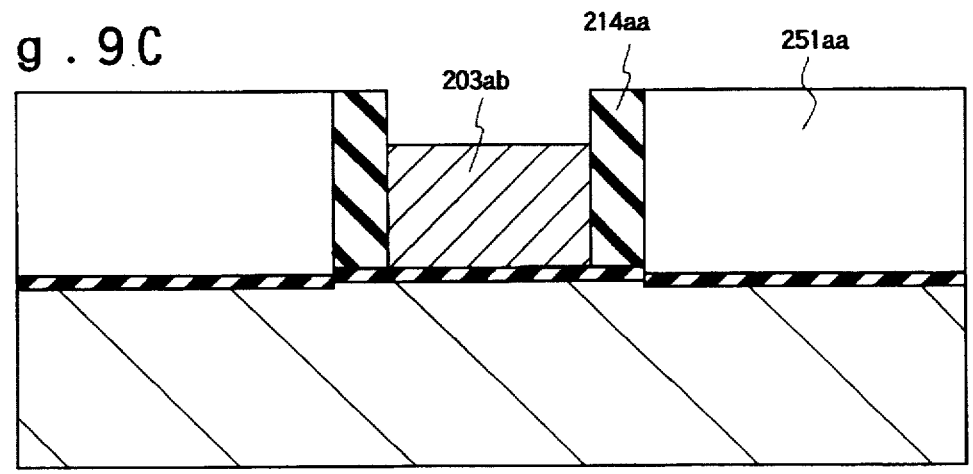

Next, as shown in FIG. 9C, the polysilicon film pattern 203aa is selectively etched back by an anisotropic etching method (a fourth etching back) using hydrogen bromide as etching gas and using the photoresist film 251aa and the silicon oxide film spacer 214aa as a mask, so that a polysilicon film pattern 203ab is remained to have the film thickness of about 250 nm as a third film thickness. The top surfaces of the silicon oxide film spacers 214aa are higher than that of the polysilicon film pattern 203ab by about 130 nm.

Figure 9D:
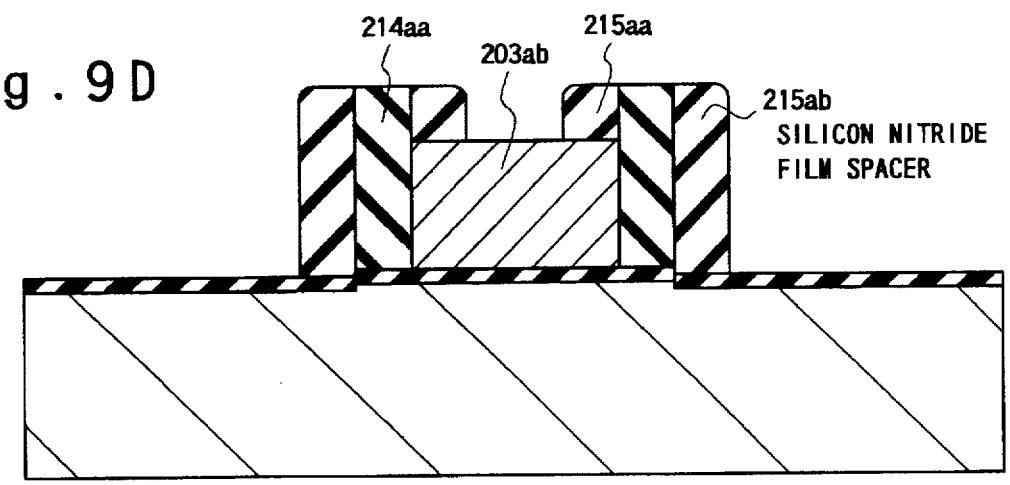

Next, As shown in FIG. 9D, the photoresist film 251aa is removed by ashing it by, for example, $O_2$ plasma. A silicon nitride film (not shown) is formed on the whole surface to have the film thickness of about 80 nm as a fourth film thickness. The silicon nitride film is selectively etched back by an anisotropic etching method (a fifth etching back) using mixed gas of $CF_4$ gas, $H_2$ gas, $N_2$ gas and $SiH_4$ gas as etching gas, so that silicon nitride film spacers 215aa are formed on the polysilicon film pattern 203ab in contact with the side surfaces of the silicon oxide film spacers 214aa on the side of the polysilicon film pattern 203ab to have the film thickness of about 130 nm and silicon nitride film spacers 215ab are formed on the side surfaces of the silicon oxide film spacer 214aa on the side opposite to the polysilicon film pattern 203ab to have the film thickness of about 380 nm.

Figure 9E:
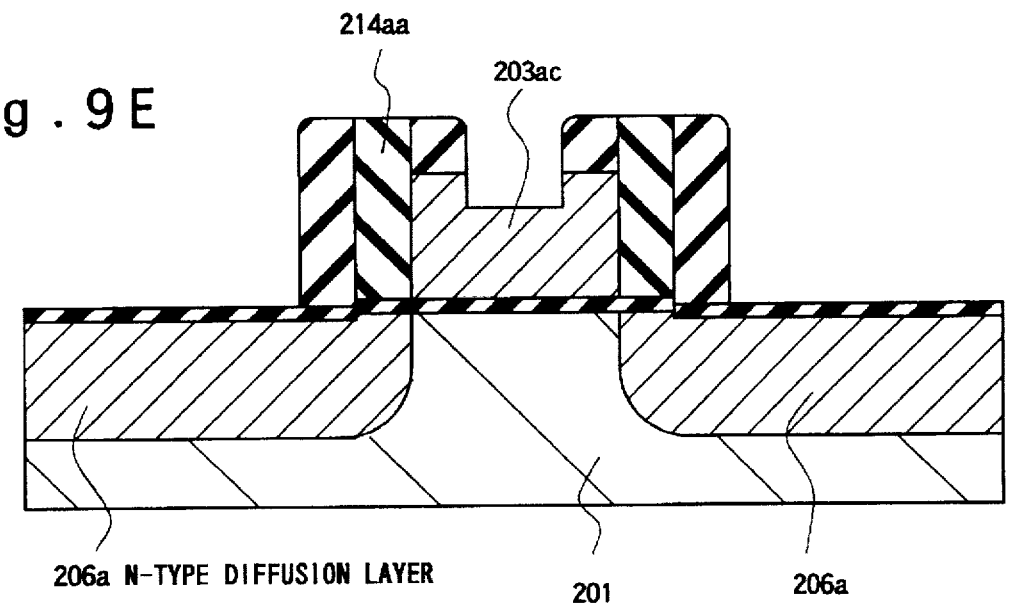

Next, as shown in FIG. 9E, ion injection of arsenic (As) is performed using the polysilicon film pattern 203ab, silicon oxide film spacers 214aa and silicon nitride film spacers 215ab as a mask to form n-type diffusion layers 206a having the junction depth of about 0.15 μm. It should be noted that the formation of the n-type diffusion layers 206a may be performed immediately after the photoresist film 251aa is removed. In this case, for instance, a sixth etching back is performed in the same manner as the above fourth etching back and the polysilicon film pattern 203ab is changed into a polysilicon film pattern 203ac having a concave portion in the central portion of the top surface which concave portion is parallel to the direction of the gate width, i.e., the direction of channel width and has a predetermined depth, e.g., about 50 nm.

It should be noted that the sixth etching back process for converting to the polysilicon film pattern 203ac may be either isotropic etching or anisotropic etching. Further, if the fifth etching back process is performed as an anisotropic etching method using mixed gas of $CHF_3$ and $SF_6$ as the etching gas, this sixth etching back process may be omitted. In this case, the heights of two silicon nitride film spacers formed are lower than those of the silicon nitride film spacers 215aa and 215ab, respectively. In either case, the surface of n-type diffusion layers 206a or the p-type silicon substrate 101 are protected by the silicon oxide film 244ab in the etching process.

Figure 9F:
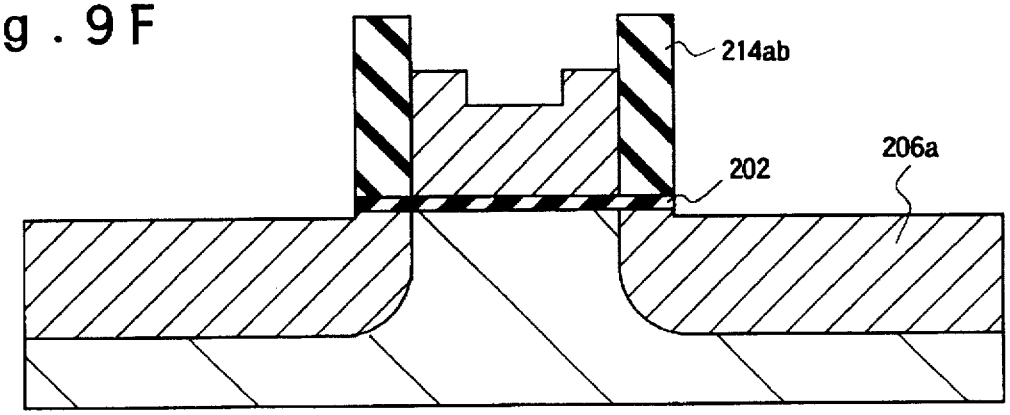

Next, as shown in FIG. 9F, the silicon nitride film spacers 215aa and 215ab are removed by a seventh etching back process which is the same as the fifth etching back process. It should be noted that since the silicon oxide film 244ab is remained in this stage, if the polysilicon film pattern is of the n-type even though the present invention is applied to a p-channel MOS transistor, the silicon nitride film spacers 215aa and 215ab can be removed by hot phosphoric acid. Subsequently, the silicon oxide film spacers 214aa and silicon oxide film 244ab are selectively etched back by an anisotropic etching method (an eighth etching back) using mixed gas of $CHF_3$ gas and CO gas as the etching gas, as in the third etching back process. As a result, the silicon oxide film spacers 214aa are changed to silicon oxide film spacers 214ab having a predetermined height, e.g., the height of about 370 nm in this example, and the silicon oxide film 244ab is removed. The desired depth in the concave potion of the polysilicon film pattern 203ac preferably smaller than a difference in height between the silicon oxide film spacers 214ab and the polysilicon film pattern 203ab (polysilicon film pattern 203ac).

Figure 9G:
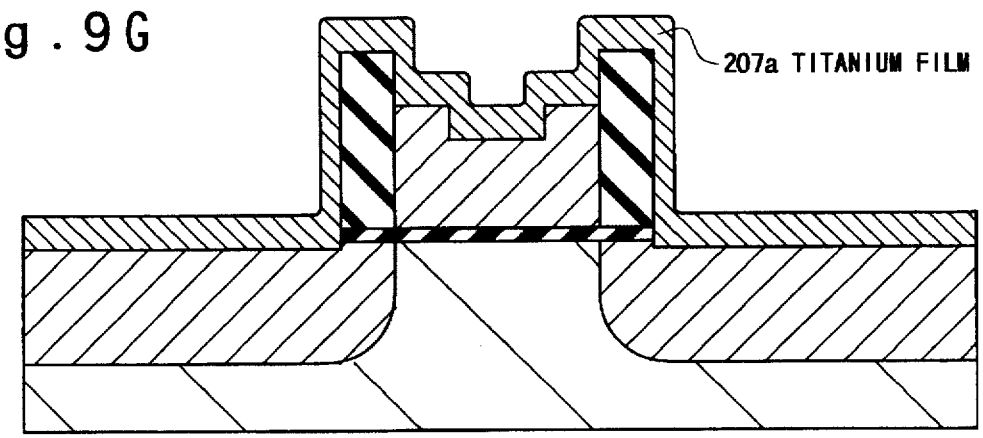

Next, as shown in FIG. 9G, the titanium film 207a is formed on the whole surface to have the film thickness of about 50 nm in a flat portion, by the same method as the first embodiment. A contact width between the titanium film 207a and the polysilicon film pattern 203ac is as many as about 450 nm which is 1.28 times longer than the gate length. A fifth film thickness, which is the film thickness of the titanium film 207a, is preferably thinner than a difference between the predetermined height as the height of the silicon oxide film spacers 214ab and the third film thickness as the height of the polysilicon film pattern 203ab or 203ac. On the other hand, the desirable relation of the fifth film thickness and the desired depth of the concave portion cannot be primarily determined but determined based on the step coverage of the titanium film 207a and width of the concave portion.

Figure 9H:
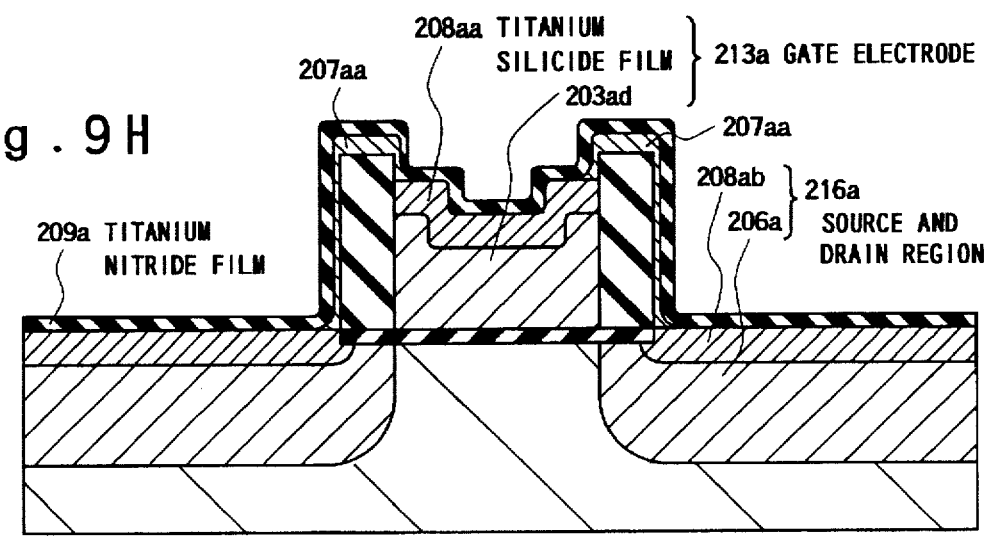

Next, as shown in FIG. 9H, lamp annealing is performed in a nitrogen ambient at 650° C. for 30 seconds and 850° C. for 10 seconds in this order, as in the first embodiment. Through this heat treatment, the titanium silicide films 208aa and 208ab having the thickness of about 80 nm and the titanium nitride film 209a having the thickness of about 20 nm are formed, so that the polysilicon film pattern 203ac is changed into a polysilicon film pattern 205ad having the thickness of about 210 nm in a thick portion and a titanium film 207aa is remained. As a result, a gate electrode 213a composed of the polysilicon film pattern 203ad and the titanium silicide film 208aa and source and drain regions 216a composed of the n-type diffusion layers 206a and the titanium silicide films 208ab are formed. In this case, the separation distance between the titanium silicide film 208aa and the titanium silicide film 20bab is about 570 nm which is further greater than 350 nm.

Figure 9I:
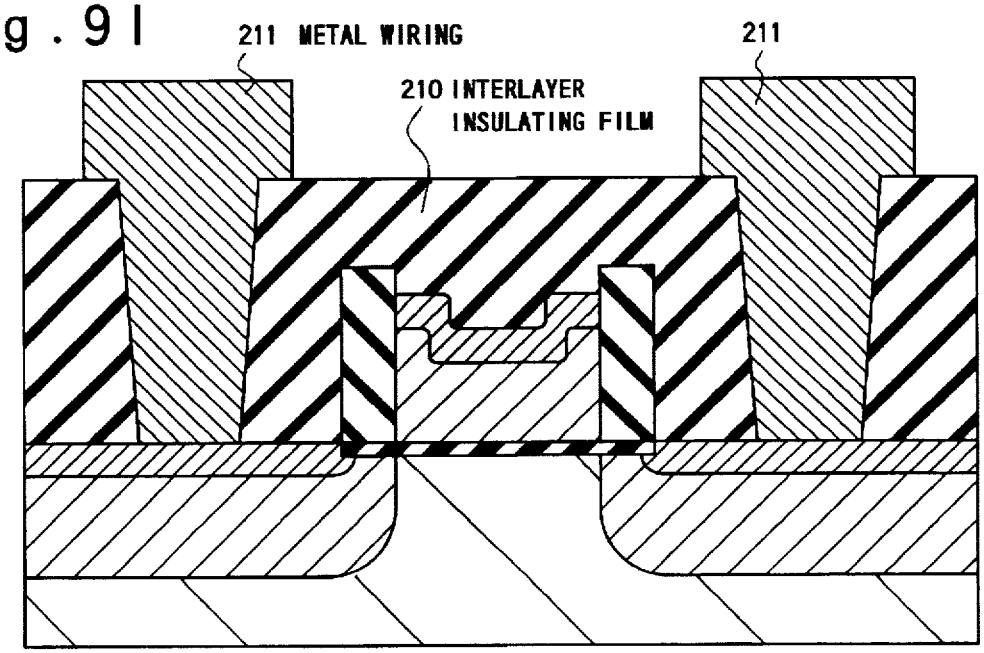

Next, as shown in FIG. 9I, the titanium film 207aa and the titanium nitride film 209a are selectively etched by $H_2O_2$ solution (to which $NH_4OH$ is often added), as in the first embodiment. In this manner, the MOS transistor of the present embodiment is completed. Thereafter, the flattening of the surface of MOS transistor is performed through the formation of tetraethoxysilane (TEOS) BPSG film and mechanically chemical polishing (MCP) and then an interlayer insulating film 210 is formed. Subsequently, after contact holes are formed in the interlayer insulating film 210 to reach the source and drain regions 216a, metal wirings 211 of aluminium-silicon-copper alloy films are formed using, for example, a titanium film and a titanium nitride film as barrier films.

The fifth embodiment has the same advantages as the first embodiment. Further, according to the fifth embodiment, it is advantageous that the difference between height between the silicon oxide film spacer 214ab and the polysilicon film pattern 203ab (the polysilicon film pattern 203ac) has a high degree of freedom of setting, which is different from the first, second and fourth embodiments in which the degree of freedom of setting is dependent upon the film thickness of the silicon oxide film spacer which is directly contact with the polysilicon film pattern. In addition, the present embodiment has the same advantages as the third embodiment with respect to application to a CMOS transistor. Further, in the present embodiment, since the insulating film spacers are composed of only the silicon oxide film spacer unlike the first to fourth embodiments, the present embodiment is superior to either of the first to fourth embodiments in degradation of device characteristics due to injection of hot carriers.

It should be noted that the present invention is not limited to the values described in the fifth embodiment such as the film thickness of the gate oxidation film 202, the film thickness and line width of the polysilicon film pattern 203a, the film thicknesses of the polysilicon film pattern 203ab, silicon oxide film 204a, and silicon oxide film 244a, the height of the silicon oxide film spacer 214ab, the film thicknesses of the silicon nitride film 215aa and silicon nitride film spacer 215ab, the depth of the concave potion on the polysilicon film pattern 203ac, the junction depth of the n-type diffusion layers 206a, the film thickness of the titanium film 207a, the temperature and time period of the lamp annealing, the film thicknesses of the titanium silicide film 208aa and 208ab, and the film thickness of the titanium nitride film 209a.

Next, the MOS transistor according to the sixth embodiment of the present invention will be described below with reference to FIGS. 10A to 10G. In this embodiment, a method of forming a titanium film is different from the fifth embodiment. The manufacturing processes of the MOS transistor according to the sixth embodiment will be described below.

Referring to FIG. 10A, a gate insulating film 202 and other films are formed on the surface of p-type silicon substrate 201 by the same method as in the fifth embodiment. A polysilicon film (not shown) is formed on the gate insulating film 202 to have the line width (gate length) of about 350 nm and the film thickness of about 400 nm. Then, a first silicon oxide film (not shown) is formed on the whole surface to have the film thickness of about 180 nm. This silicon oxide film and the gate insulating film 202 are etched back (a first etching back), so that silicon oxide film spacers 214b are formed to have the height of about 400 nm. Subsequently, thermal oxidization is performed so that the polysilicon film pattern is changed into a polysilicon film pattern 203ba having the film thickness of about 390 nm as a second film thickness. A second silicon oxide film 244ba is formed on the polysilicon film pattern 203ba to have the film thickness of about 20 nm and a third silicon oxide film 244ab is also formed on a potion of the surface of the p-type silicon substrate 201 from which the gate insulating film 202 is removed, to have the film thickness of about 10 nm. Next, ion injection of As is performed using the polysilicon film pattern 203ba and the silicon oxide film spacer 214b as a mask to form n-type diffusion layers 206b on the surface of the P-type silicon substrate 201 to have a junction depth of about 0.15 μm.

Next, as shown in FIG. 10B, a photoresist film (not shown) is coated on the whole surface. Then, the photoresist film is etched back (the second etching back) so that a photoresist film 251ba is remained. Subsequently, the silicon oxide film 244ba and the silicon oxide film spacer 214b are selectively etched back (the third etching back) so that the top surface of the polysilicon film pattern 203ba is completely exposed and the silicon oxide film spacer 214ba having the height of about 380 nm is remained. Further, polysilicon film pattern 203ba is selectively etched back (the fourth etching back) so that a polysilicon film pattern 203bb is remained to have the film thickness of about 250 nm as a third film thickness. The top surfaces of the silicon oxide film spacers 214ba are higher than that of the polysilicon film pattern 203bb by about 130 nm.

Next, as shown in FIG. 10C, the same processes as in the fifth embodiment are performed. More particularly, the photoresist film 251ba is removed by ashing it by $O_2$ plasma. A silicon nitride film (not shown) is formed on the whole surface to have the film thickness of about 50 nm as the fourth film thickness. The silicon nitride film is selectively etched back (the fifth etching back), so that silicon nitride film spacers 215ba are formed on the side surfaces of the silicon oxide film spacers 214ba on the side of the polysilicon film pattern 203bb to have the film thickness of about 130 nm and silicon nitride film spacers 215bb are formed on the side surfaces of the silicon oxide film spacers 214ba on the side opposite to the polysilicon film pattern 203bb to have the height of about 380 nm. Further, the polysilicon film pattern 203bb is selectively etched back (the sixth etching back) using the silicon oxide film spacers 214ba, silicon oxide film 244bb and silicon nitride film spacers 215ba and 215bb. Through the sixth etching back, the polysilicon film pattern 203bb is changed into a polysilicon film pattern 203bc to have a concave portion on the central top surface which concave portion is parallel to the direction of gate width (channel length) and has a desired depth, e.g., of about 30 nm.

Figure 10D:
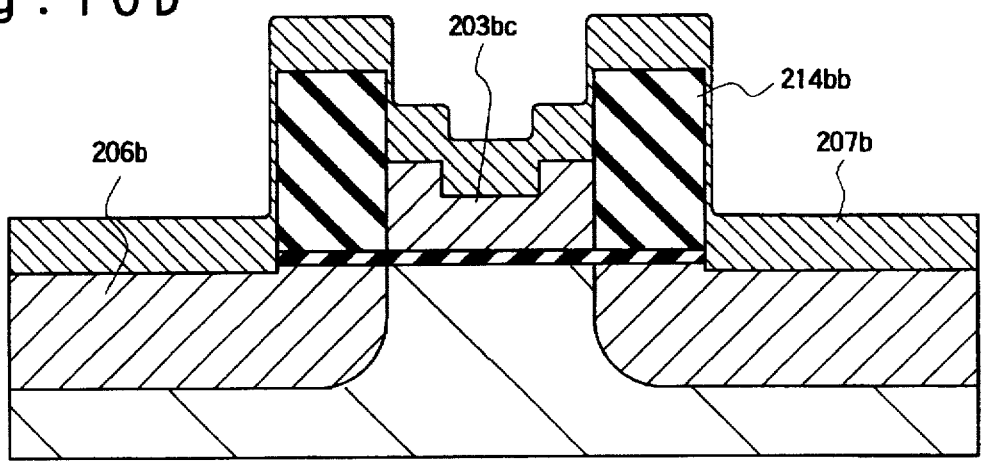

Next, as shown in FIG. 10D, the same processes as in the fifth embodiment are performed. More specifically, the silicon nitride film spacers 215ba and 215bb are removed by the seventh etching back process. It should be noted that since the silicon oxide film 244bb is also remained in this stage in the present embodiment, if the polysilicon film pattern is of the n-type even though the present invention is applied to a p-channel MOS transistor, the silicon nitride film spacers 215ba and 215bb can be removed by hot phosphoric acid. Subsequently, the silicon oxide film spacers 214ba and silicon oxide film 244ba are selectively etched back (the eighth etching back). Through the etching back, the silicon oxide film spacers 214ba are changed to silicon oxide film spacers 214bb having a predetermined height, e.g., the height of about 370 nm in this example, and the silicon oxide film 244bb is removed. Next, a titanium film 207b is formed to have the film thickness of about 70 nm in a flat portion as the fifth film thickness using a collimated sputtering method in the same manner as in the second embodiment. A contact width between the titanium film 207b and the polysilicon film pattern 203bc is as many as about 410 nm which is about 1.17 times longer than the gate channel length. The titanium film 207b has the film thickness of at most 7 nm on the side surface of the silicon oxide film spacer 214bb, which is about 1/10 the film thickness at the flat portion. The film thickness of the titanium film 207b is preferably thinner than a difference in height between the top surface of silicon oxide film spacer 214bb and the top surface of the polysilicon film pattern 203bb (or the polysilicon film pattern 203bc), i.e., (the predetermined height) —(the third film thickness).

Figure 10E:
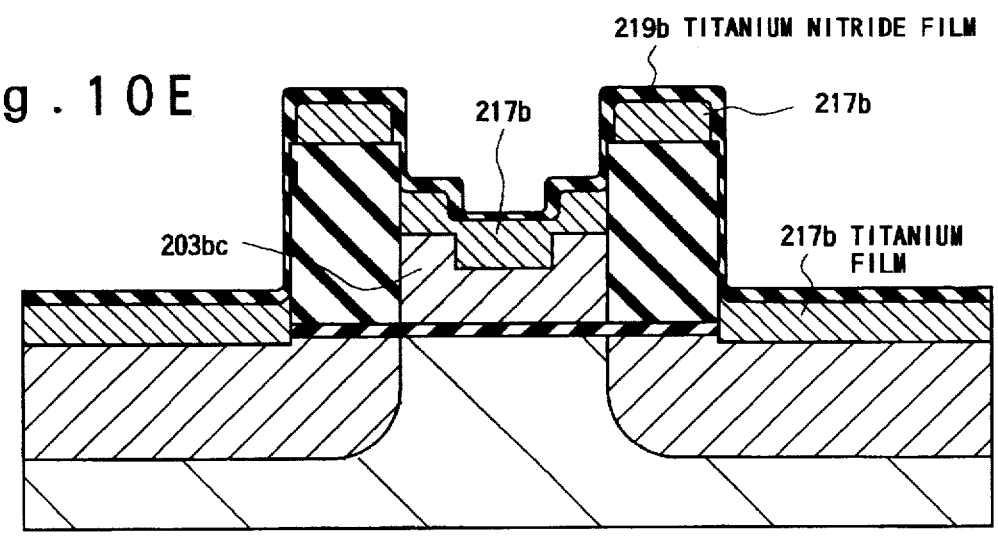

Next, as shown in FIG. 10E, the surface of the titanium film 207b is plasma-nitrided using mixed gas of $N_2$ gas and $NH_3$ gas under the pressure of about 13 Pa and at the temperature of about 350° C. in the same manner as in the second embodiment, so that a titanium nitride film 219b is formed to have the film thickness of about 20 nm as the sixth film thickness in a flat portion. Further, through the plasma nitridation a titanium film 217bb is remained. It is preferable that the film thickness of the titanium film 207b as the fifth film thickness is thicker than a sum of the desired depth of the concave portion on the polysilicon film pattern 203bc and the film thickness of the titanium nitride film 219b as the sixth film thickness.

Figure 10F:
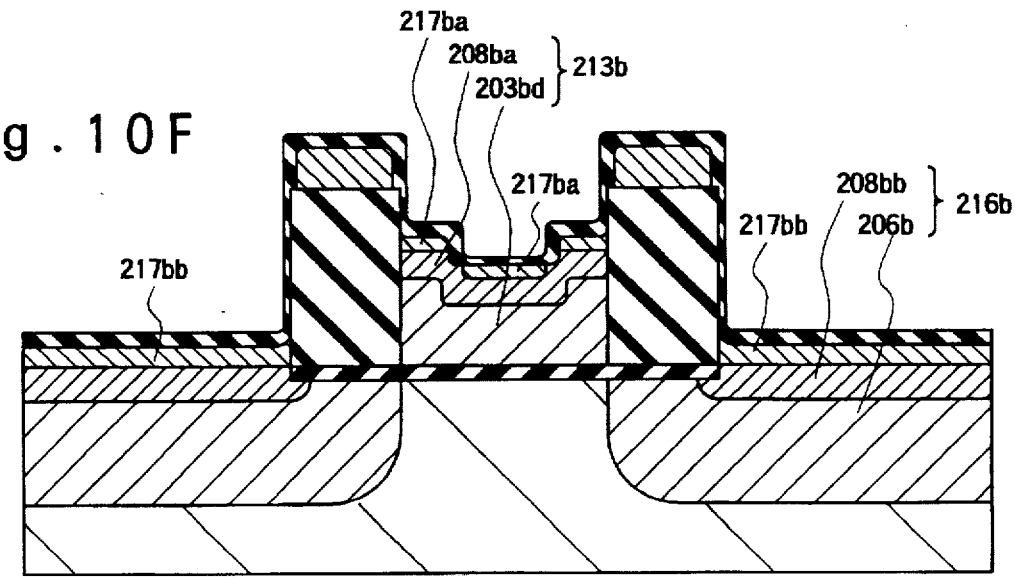

Next, as shown in FIG. 10F, lamp annealing is performed in a nitrogen or argon ambient at 650° C. for 30 seconds and 850° C. in the same manner as in the second embodiment. Through this heat treatment, the titanium silicide films 208ba and 208bb having the thickness of about 80 nm and the polysilicon film pattern 203bc is changed into a polysilicon film pattern 203bd having the film thickness of about 210 nm in a thick portion. Also, a titanium film 217ba is remained between the titanium silicide film 208ba and the titanium nitride film 219b and titanium films 217bb are remained between the titanium silicide films 208bb and the titanium nitride film 219b. As a result, a gate electrode 213b composed of the polysilicon film pattern 203bd and the titanium silicide film 208ba, and source and drain regions 216b composed of the n-type diffusion layers 206b and the titanium silicide films 208bb are formed. In this case the separation distance is about 670 nm which is further longer than the gate or channel length.

Figure 10G:
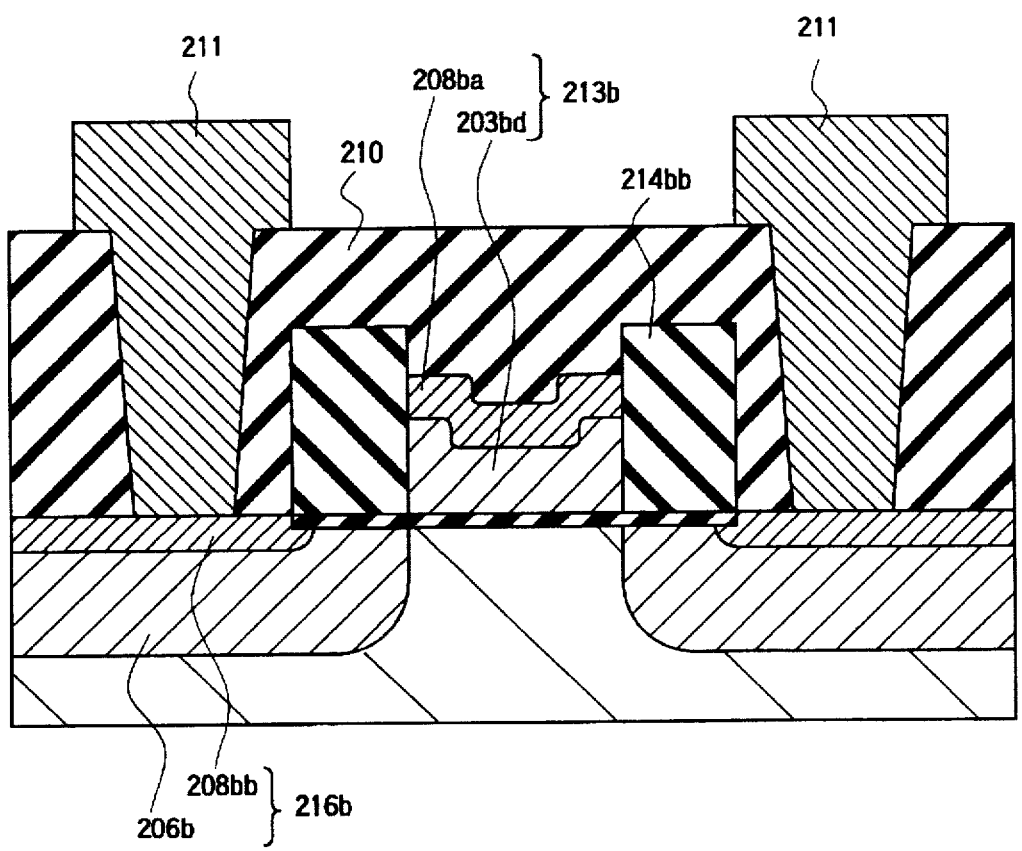

Subsequently, as shown in FIG. 10G, in the same manner as in the fifth embodiment, an interlayer insulating film 210 is formed and then contact holes and metal wirings 211 are formed.

The sixth embodiment has the same advantages as the fifth embodiment. Further, the present embodiment also has the same advantages as the second embodiment.

It should be noted that the present invention is not limited to the values described in the sixth embodiment such as the film thickness and line width of the polysilicon film pattern 203ba, the film thicknesses of the polysilicon film patterns 203ba and 203bb, silicon oxide film spacer 214b, and silicon oxide films 244ba and 244bb, the height of the silicon oxide film spacer 214bb, the film thicknesses of the silicon nitride film 215ba, and silicon nitride film spacer 215bb, the depth of the concave potion on the polysilicon film pattern 203bc, the junction depth of the n-type diffusion layers 206b, the film thickness of the titanium film 207b, the temperature and pressure of the plasma nitridation, the temperature and time period of the lamp annealing, the film thicknesses of the titanium silicide films 208ba and 208bb, and the film thickness of the titanium nitride film 219b.

Figure 11:
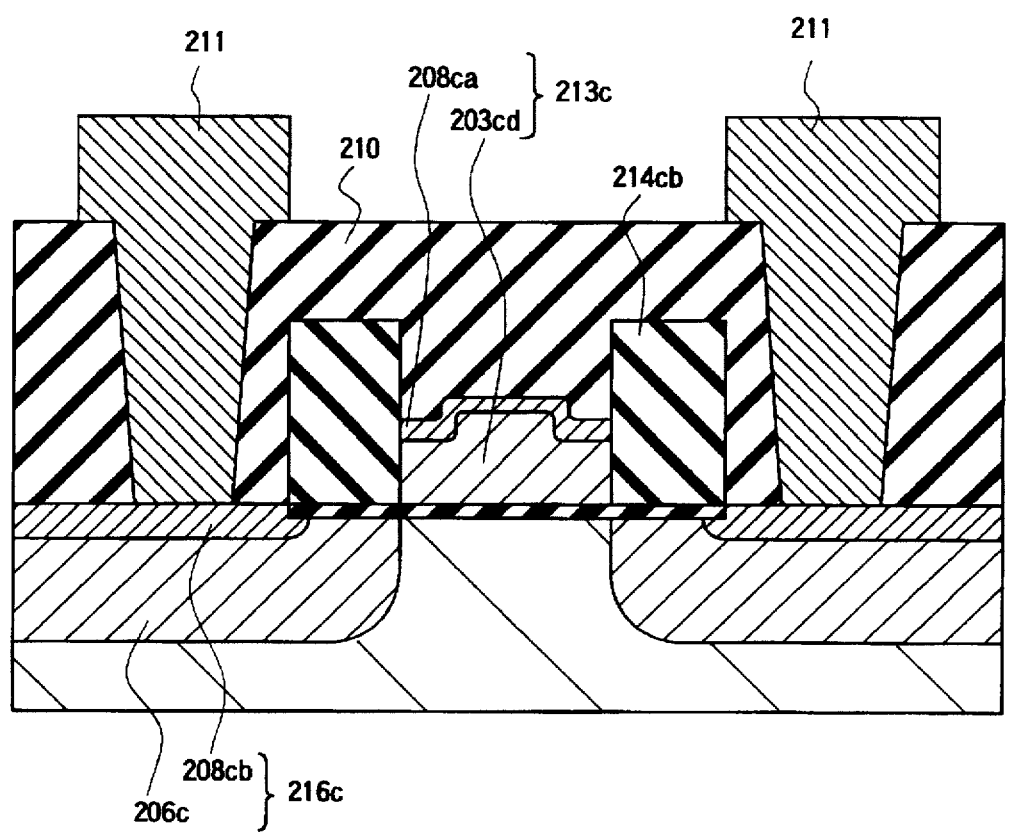
FIG. 11 is a schematic cross sectional view showing the semiconductor device according to a the seventh embodiment of the present invention.

Next, the semiconductor device according to the seventh embodiment of the present invention will be described with reference to FIG. 11. In FIG. 11, the conducive polysilicon film pattern 203cd has a convex portion of a predetermined height in the channel length direction, unlike the sixth embodiment. In this embodiment, the separation distance can be further elongated. The manufacturing process of the semiconductor device of the seventh embodiment could be readily understood from the sixth embodiment to a person skilled in the art.

In the above embodiments, the gate length is 350 nm. The inventor applied the present invention to semiconductor devices having various channel lengths such as 250 nm and 200 nm. As a result, in a case of the semiconductor device of a 200-nm gate length, when the contact length is 240 nm (240/200=1.2) and the separation distance is 250 nm (250/200=1.25), the good result of a practicable level was obtained. When the semiconductor device is scaled down, in a case of the gate length of 150 nm or 100 nm, the contact length would be sufficient to have the contact length of about 1.2 times or more the gate length, e.g., of 200 nm or 140 nm even if the grain size is considered. A good result is obtained in a case of the contact length of 200 nm. On the other hand, since the suppression of bridging phenomenon is a function of separation function, it would be difficult to decrease the separation distance to a length shorter than 250 nm. Therefore, in a case of the gate length of 150 nm or 100 nm, it would be preferable that the contact length is 200 or 140 nm or above and the separation distance is 250 nm or above.

As described above, according to the semiconductor device of the present invention, the MOS transistor has a salicide structure and includes a silicon substrate, a gate insulating film, a gate electrode in which a polysilicon film pattern and a first titanium silicide film are laminated, source and drain regions each of which is composed of a second titanium silicide film and a diffusion layer, and an insulating film spacer structure provided on the side surfaces of the gate electrode. The top surface of the insulating film spacer structure is higher than that of the gate electrode, resulting in the separation distance of 350 nm or above. In addition, the contact length between the first titanium silicide film and the polysilicon film pattern is longer than the gate length, e.g., about 1.2 times or more longer than the gate length. These features can be achieved by the spacer structure of a lamination structure of first insulating film spacers which are contact with the gate electrode and second insulating film spacers and by the first insulating film spacers having the heights lower than the top surface of the gate electrode or a concave portion provided at the central portion of the polysilicon film pattern in parallel to the gate length direction.

Therefore, the first silicide film can be readily obtained to have the C54 structure in a low resistivity phase, so that increase of the gate electrode in resistivity can be readily suppressed. Further, as seen from the structure of the semiconductor device, the separation distance between the first titanium silicide film and the second titanium silicide film of each of the source and drain regions can be elongated by the insulting film spacer structure, compared to the conventional semiconductor device. As a result, it is made possible to suppress any bridging phenomenon by which a leakage current is increased between the gate electrode and the source and drain regions.

What is claimed is:

1. A semiconductor device, comprising:

a gate insulating film on a semiconductor region of a first conductive type;

a gate electrode provided on said gate insulating film, and comprising a conductive polysilicon film and a first titanium silicide film formed on said conductive polysilicon film a contact length between said conductive polysilicon film and said first titanium silicide film being longer than a gate length defined by the contact length of said conductive polysilicon film and said gate insulating film;

source and drain regions of a second conductive type, each of which comprises an impurity layer formed in a surface region of said semiconductor region and a second titanium silicide film formed on said impurity layer;

an insulating film spacer structure including first and second insulating film spacers, each of said first insulating film spacers being provided to contact with a side surface of said conductive polysilicon film of said gate electrode and each of said second insulating film spacers having the top surface thereof higher than a top surface of said gate electrode wherein said first titanium silicide film is spaced apart from said second insulating film spacers;

an interlayer insulating film covering said gate electrode, said source and drain regions and said insulating film spacer structure and having contact holes to said gate electrode and said source and drain regions; and a wiring pattern connected to said gate electrode and said source and drain regions through said contact holes.

2. The semiconductor device according to claim 1, wherein said insulating film spacer structure has a separation distance along the surface of said spacer structure longer than the distance between said first titanium silicide film and each of said second titanium silicide films of said source and drain regions along said side surface of said conductive polysilicon film.

3. The semiconductor device according to claim 1, wherein at least one of said first insulating film spacers and said second insulating film spacers is insulative nitride film spacers.

4. The semiconductor device according to claim 1, wherein said first insulating film spacers are equal to or lower than a top surface of said conductive polysilicon film of said gate electrode and said first silicide film covers said conductive polysilicon film in the gate length direction between said first insulating film spacers.

5. The semiconductor device according to claim 1, wherein said conductive polysilicon film has a convex or concave surface portion in the gate length direction and said first silicide film is formed along said convex or concave surface portion.

6. A method of manufacturing a semiconductor device, comprising the steps of:

forming a gate insulating film on a semiconductive silicon region of a first conductive type;

forming a gate polysilicon film pattern for a gate electrode to have a predetermined gate length defined as the contact length between said gate polysilicon film pattern and said gate insulating film;

forming an insulating film spacer structure including at least two insulating film spacers as first and second insulating film spacers, wherein said first insulating film spacers are in contact with the side surfaces of said gate polysilicon film pattern such that the top surfaces of said first insulating film spacers are lower than a top surface of said gate polysilicon film pattern, so that a peripheral surface length of said gate polysilicon film pattern is longer than said gate length;

forming source and drain layers of a second conductive type in the surface region of said semiconductive silicon region using said gate polysilicon film pattern and said insulating film spacer structure as a mask;

depositing a metal film so as to cover the surface of said gate polysilicon film pattern in the gate length direction; and forming a first silicide film from said metal film and said gate polysilicon film pattern and a second silicide film from said metal film and said source and drain layers such that a top surface of said first silicide film is lower than a top surface of said insulating film spacer structure, wherein said first titanium silicide film is spaced apart from said second insulating film spacers.

7. A method according to claim 6, wherein said step of forming an insulating film spacer structure comprising the steps of:

depositing a first insulating film including said gate polysilicon film pattern;

depositing a second insulating film on said first insulating film;

selectively etching back said second insulating film by an anisotropic etching method to form said second insulating film spacers on said first insulating film apart from said gate polysilicon film pattern and said first silicide film such that said second insulating film spacers have the heights higher than the top surface of said first silicide film; and selectively etching back said first insulating film by an anisotropic etching method to form said first insulating film spacers which have said second insulating film spacers provided thereon and are contact with said gate polysilicon film pattern to have the height lower than the top surface of said gate polysilicon film pattern.

8. A method according to claim 6, wherein said insulating film spacer structure comprises third insulating film spacers in addition to said first and second insulating film spacers, and wherein said step of forming a spacer structure comprising the steps of:
depositing a first insulating film on the whole surface including said gate polysilicon film pattern;
depositing a second insulating film on said first insulating film;
depositing a third insulating film on said second insulating film;
selectively etching back said third insulating film by an anisotropic etching method to form said third insulating film spacers on said second insulating film;
selectively etching back said second insulating film by an anisotropic etching method to form said second insulating film spacers such that said second insulating film spacers have the heights higher than the top surface of said first silicide film; and
selectively etching back said first insulating film by an anisotropic etching method to form first insulating film spacers which have said second insulating film spacers provided thereon and are contact with said gate polysilicon film pattern to have the height lower than the top surface of said gate polysilicon film pattern.

9. The method according to claim 6, further comprising the step of forming a concave or convex portion on the surface of said gate polysilicon film pattern such that said concave or convex portion has a predetermined depth or height and extends in the direction of said channel length.

10. The method according to claim 6, wherein said step of forming said first and second silicide films comprises the steps of:
nitriding the surface of said metal film;
forming said first and second silicide films using non-nitrided metal film from below the surface of said nitrided metal film; and
removing said metal nitride film and a non-nitrided and non-silicided portion of said metal film.

11. The method according to claim 10, wherein said step of depositing a metal film including depositing a titanium film by a collimated sputtering method such that said titanium film on said insulating film spacer structure can be all nitrided.

12. The method according to claim 10, wherein said nitriding step and said step of forming said first and second silicide films are simultaneously performed by annealing in a nitrogen ambient.

13. The method according to claim 10, wherein said step of nitriding the surface of said titanium film includes nitriding the surface of said titanium film such that said titanium film on the side surfaces of said spacer structure on the side opposite to said gate polysilicon film pattern can be all nitrided.

14. The method according to claim 10, wherein said nitriding step includes nitriding the surface of said titanium film by a plasma nitriding method.

15. The method according to claim 10, wherein said metal film is a titanium film and said step of forming said first and second silicide films includes annealing at a relatively low temperature to form said first and second silicide films having a C49 structure and then annealing at a relatively high temperature to change from the C49 structure to a C54 structure.

16. A semiconductor device, comprising:
a gate insulating film on a semiconductor region of a first conductive type;
a gate electrode provided on said gate insulating film, and comprising a first conductive polysilicon film with a concave portion or convex portion having a predetermined depth or height and extending in a gate length direction defined as the contact length of said first conductive polysilicon film and said gate insulating film, and a first silicide film formed to cover the surface of said first conductive polysilicon film, a contact length between said first conductive polysilicon film and said first silicide film being longer than said gate length of said gate electrode;
source and drain regions of a second conductive type, each of which comprises an impurity layer formed in the surface region of said semiconductor region and a second silicide film formed on said impurity layer; and
an insulating film spacer structure including insulating film spacers, each of which is provided to contact with only a side surface of said fast conductive film and said first silicide film of said gate electrode and to have a top surface thereof higher than a top surface of said first silicide film of said gate electrode;
an interlayer insulating film covering said gate electrode, said source and drain regions and said insulating film spacer structure and having contact holes to said gate electrode and said source and drain regions; and
a wiring pattern connected to said gate electrode and said source and drain regions through said contact holes.

17. The semiconductor device according to claim 16, wherein a separation distance along the surface of said spacer structure is longer than the distance between said first silicide film and each of said second silicide films along said side surface of said conductive polysilicon film.

18. The semiconductor device according to claim 16, wherein each of said first and second silicide films has resistivity as low as 15 μΩ.cm or below.

19. A method of manufacturing a semiconductor device, comprising the steps of:
forming a gate insulating film on a semiconductive silicon region of a first conductive type
forming a polysilicon film for a gate electrode, to have a predetermined gate length of a contact length of said polysilicon film and said gate insulating film and to have a film thickness thicker than the gate length;
forming insulating film spacers which are in contact with the side surfaces of said polysilicon film to have the same height as said polysilicon film;
selectively etching said polysilicon film to form a gate polysilicon film such that a peripheral surface length of said gate polysilicon film longer than said gate length and a surface of said gate polysilicon film is lower than top surfaces of said insulating film spacers;
forming source and drain regions of a second conductive type on the surface of said semiconductive silicon region using said gate polysilicon film and said insulating film spacers as a mask;
depositing a titanium film on the surface of the source and drain regions after said forming thereof; and
forming a first silicide film from said titanium film and said gate polysilicon film and a second silicide film from said titanium film and said source and drain regions such that a top surface of said tint silicide film is lower than a top surface of said insulating film spacer structure, such that said insulating film spacer contacts only the side surfaces of said polysilicon film.

20. A method according to claim 19, wherein said step of selectively etching said polysilicon film includes forming a concave or convex portion on the surface of said gate polysilicon film pattern such that said concave or convex portion has a predetermined depth or height and extends in the direction of said gate length.

21. The method according to claim 19, wherein said step of forming said first and second silicide films comprises the steps of:

nitriding the surface of said titanium film;

forming said first and second silicide films using non-nitrided titanium film from below the surface of said nitrided metal film; and removing said titanium nitride film and said non-nitrided titanium film.

22. The method according to claim 21, wherein said step of depositing a titanium film including depositing a titanium film by a collimated sputtering method.

23. The method according to claim 21, wherein said nitriding step and said step of forming said first and second silicide films are simultaneously performed by annealing in a nitrogen ambient.

24. The method according to claim 21, wherein said step of nitriding the surface of said titanium film includes nitriding the surface of said titanium film such that said titanium film on the side surfaces of said spacer structure on the side opposite to said gate polysilicon film pattern is all nitrided.

25. The method according to claim 21, wherein said nitriding step includes nitriding the surface of said titanium film by a plasma nitriding method.

26. The method according to claim 21, wherein said annealing step includes annealing at a relatively low temperature to form said first and second silicide films having a C49 structure of titanium silicide and then annealing at a relatively high temperature to change from C49 structure to a C54 structure.

27. A semiconductor device, comprising:

a gate insulating film on a semiconductor region of a first conductive type;

a gate electrode provided on said gate insulating film defining a gate length, and comprising a conductive polysilicon film and a first titanium silicide film formed on said conductive polysilicon film, a contact length between said conductive polysilicon film and said first titanium silicide film in being longer than said gate length;

source and drain regions of a second conductive type, each of which comprises an impurity layer formed in a surface region of said semiconductor region and a second titanium silicide film formed on said impurity layer; and an insulating film spacer structure including first and second insulating film spacers and formed in alignment with said gate electrode, each of said first insulating film spacers being provided to contact with a side surface of said conductive polysilicon film of said gate electrode and each of said second insulating film spacers having the top surface thereof higher than a top surface of said gate electrode, wherein said first titanium silicide film is spaced apart from said second insulating film spacers.

* * * * *

UNITED STATES PATENT AND TRADEMARK OFFICE
CERTIFICATE OF CORRECTION

PATENT NO. : 5,739,573
DATED : April 14, 1998
INVENTOR(S) : Hiroshi Kawaguchi It is certified that error appears in the above-identified patent and that said Letters Patent is hereby corrected as shown below:

Claim 16, Col. 28, line 24, "fast" should be --first--.

Claim 18, Col. 28, line 41, after "has" please insert --a--.

Claim 19, Col. 28, line 56, please insert --is-- after "film".

Signed and Sealed this

Twenty-second Day of September, 1998

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,739,573
DATED : Apr. 14, 1998
INVENTOR(S) : Kawaguchi

It is certified that error appears in the above-identified patent and that said Letters Patent is hereby corrected as shown below:

Claim 19, Co. 28, line 56, please insert -- is -- after " film ".

Signed and Sealed this

Third Day of November, 1998

*Attest:*

BRUCE LEHMAN

*Attesting Officer*     *Commissioner of Patents and Trademarks*